US008686392B2

(12) United States Patent
Tsukamoto

(10) Patent No.: US 8,686,392 B2
(45) Date of Patent: Apr. 1, 2014

(54) SEMICONDUCTOR DEVICE

(75) Inventor: Keisuke Tsukamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 213 days.

(21) Appl. No.: 13/348,424

(22) Filed: Jan. 11, 2012

(65) Prior Publication Data
US 2012/0193601 A1 Aug. 2, 2012

(30) Foreign Application Priority Data

Jan. 27, 2011 (JP) .................. 2011-015383

(51) Int. Cl.
*H01L 29/06* (2006.01)
*H01L 27/22* (2006.01)
(52) U.S. Cl.
CPC .................... *H01L 27/228* (2013.01)
USPC ............... 257/5; 438/652; 438/669; 365/158
(58) Field of Classification Search
USPC .......... 257/5, 427, E27.002, E27.005, 773, 257/776; 438/652–669; 365/1, 185.01, 48, 365/49.1, 50, 55, 63, 74, 129, 131, 158, 365/171, 173
See application file for complete search history.

(56) References Cited

U.S. PATENT DOCUMENTS

| 6,466,475 | B1 | 10/2002 | Nickel |
| 6,806,524 | B2 | 10/2004 | Ooishi |
| 6,928,015 | B2 | 8/2005 | Ooishi |
| 7,372,118 | B2 | 5/2008 | Asao et al. |

FOREIGN PATENT DOCUMENTS

| JP | 2003-187570 A | 7/2003 |
| JP | 2004-228187 A | 8/2004 |
| JP | 2008-141210 A | 6/2008 |
| JP | 2008-218649 A | 9/2008 |
| JP | 2010-093277 A | 4/2010 |

*Primary Examiner* — Julio J Maldonado
*Assistant Examiner* — Robert Bachner
(74) *Attorney, Agent, or Firm* — McDermott Will & Emery LLP

(57) ABSTRACT

The semiconductor device includes a memory cell including a plurality of magnetoresistive elements disposed therein, and a peripheral circuit region disposed around the memory cell region. The magnetoresistive element includes a magnetization fixed layer, a magnetization free layer, and a tunneling insulation layer. The semiconductor device includes, above the magnetoresistive elements, a plurality of first wires extending in the direction along the main surface. In the peripheral circuit region, there is disposed a multilayer structure of lamination of a layer equal in material to the magnetization free layer, a layer equal in material to the tunneling insulation layer, and a layer equal in material to the magnetization fixed layer so as to overlap a second wire formed of the same layer as the first wire in plan view. The multilayer structure does not overlap both of a pair of adjacent second wires in plan view in the peripheral circuit region.

9 Claims, 34 Drawing Sheets

PERIPHERAL CIRCUIT REGION | MEMORY CELL REGION

PERIPHERAL CIRCUIT REGION | MEMORY CELL REGION

SEMICONDUCTOR DEVICE

CROSS-REFERENCE TO RELATED APPLICATIONS

The disclosure of Japanese Patent Application No. 2011-15383 filed on Jan. 27, 2011 including the specification, drawings and abstract is incorporated herein by reference in its entirety.

BACKGROUND

The present invention relates to a semiconductor device. More particularly, it relates to a semiconductor device having a storage device including a multilayer structure of metal materials.

As semiconductor devices such as semiconductor integrated circuits for storage, there have been conventionally used integrated circuits of storage elements each having a structure formed in a so-called column in which two or more layers each including a conductor are stacked such as a MRAM (Magnetic Random Access Memory), a ReRAM (Resistance Random Access Memory), and a PRAM (Phase change Random Access Memory). Out of these, the semiconductor devices using a MRAM are disclosed in, for example, Japanese Unexamined Patent Publication No. 2008-141210 (which will be hereinafter referred to as "Patent Document 1") and Japanese Unexamined Patent Publication No. 2008-218649 (which will be hereinafter referred to as "Patent Document 2"). For the storage element, by the current flowing through a wire electrically coupled to a storage element called a bit line, the change in electrical resistance value can be read as data.

Incidentally, in the semiconductor device including the MRAMs or the like, there are disposed a memory cell region including a plurality of storage elements such as MRAMs disposed therein in a collected manner, and a peripheral region not including storage elements such as MRAMs disposed therein, disposed in the periphery of the memory cell region in plan view. In the peripheral region, storage elements are not formed. However, there may be disposed a region in which a layer equal or similar in material to that of the storage element is formed as a dummy. The semiconductor devices in each of which a dummy pattern is formed in the peripheral region are respectively disclosed in, for example, Japanese Unexamined Patent Publication No. 2010-93277 (which will be hereinafter referred to as "Patent Document 3"), Japanese Unexamined Patent Publication No. 2003-187570 (which will be hereinafter referred to as "Patent Document 4"), and Japanese Unexamined Patent Publication No. 2004-228187 (which will be hereinafter referred to as "Patent Document 5").

[Patent Document 1]
Japanese Unexamined Patent Publication No. 2008-141210
[Patent Document 2]
Japanese Unexamined Patent Publication No. 2008-218649
[Patent Document 3]
Japanese Unexamined Patent Publication No. 2010-93277
[Patent Document 4]
Japanese Unexamined Patent Publication No. 2003-187570
[Patent Document 5]
Japanese Unexamined Patent Publication No. 2004-228187

SUMMARY

A dummy formed in a peripheral region is formed for wide-ranging purposes. For example, the dummy is formed in order to improve the finished surface upon polishing an interlayer insulation film formed at the same layer as that of a storage element to a given depth from the top surface thereof by a chemical mechanical polishing processing. The chemical mechanical polishing processing called CMP (Chemical Mechanical Polishing) is a processing of polishing and removing an interlayer insulation film formed at the same layer as that of a storage element in such a manner as to cover the top surface of a storage element until the uppermost surface of the storage element is exposed. Herein, when a dummy pattern of lamination of layers equal in materials to the storage element is formed in the peripheral region, the variations in degree of polishing of the interlayer insulation film between in the peripheral region and in the memory cell region are reduced as compared with the case where a dummy pattern is not formed. Namely, the thickness of the interlayer insulation film after polishing becomes roughly uniform throughout the whole including the memory cell region and the peripheral region. Accordingly, the uppermost surface of the interlayer insulation film becomes more flat throughout the whole.

When the uppermost surface of the interlayer insulation film becomes more flat as described above, it becomes possible to directly couple a storage element and a bit line without interposing a coupling wire such as a contact disclosed in, for example, Patent Document 1. This is because the improvement of the flatness of the interlayer insulation film can suppress the short circuit between the bit line and a conductor forming the storage element. For this reason, it is possible to omit a step of forming the coupling wire, resulting in reduction of the cost of the semiconductor device. Further, it is possible to suppress the occurrence of failure due to displacement of coupling wires, which tends to occur in a particularly miniaturized semiconductor device.

However, for example, when the dummy patterns are disposed randomly at given positions in the peripheral region in plan view, for example, some dummy patterns may be disposed in such a manner as to be each coupled with both of a pair of adjacent bit lines (in such a manner as to extend over both). In this case, the dummy pattern is generally formed of a conductor, and hence the dummy pattern may short-circuit the pair of bit lines. In the Patent Documents 3 to 5, the configuration corresponding to the dummy pattern is formed. However, any Patent Document does not disclose the positional relationship with wires corresponding to the bit lines. For this reason, even when the dummy patterns of the Patent Documents are used, the wires corresponding to the bit lines may be short-circuited. Further, in Patent Document 1, there is originally no description on a region corresponding to the peripheral region. In Patent Document 2, there is a description on the region corresponding to the peripheral region, but there is no description on the configuration corresponding to the dummy pattern formed in the region.

The present invention was completed in view of the foregoing problems. It is an object of the present invention to provide a semiconductor device which is suppressed in short circuit between adjacent bit lines, and has an interlayer insulation film polished to flatness.

A semiconductor device in accordance with one embodiment of the present invention includes the following configuration. The semiconductor device includes: a semiconductor substrate having a main surface; a memory cell region including a plurality of magnetoresistive elements formed over the main surface of the semiconductor substrate, and changing in electrical resistance according to the direction of magnetization, disposed therein; an interlayer insulation film disposed at the same layer as the magnetoresistive elements; and a peripheral circuit region disposed in the periphery of the memory cell region in plan view. The magnetoresistive element includes a magnetization fixed layer fixed in direction of magnetization, a magnetization free layer made variable in direction of magnetization, and a tunneling insulation layer interposed between the magnetization fixed layer and the magnetization free layer. The semiconductor device includes, above the magnetoresistive elements, a plurality of first wires extending in the direction along the main surface, and coupled to the top surfaces of the magnetoresistive elements. In the peripheral circuit region, there is disposed a multilayer structure of lamination of a layer equal in material to the magnetization free layer forming the magnetoresistive element, a layer equal in material to the tunneling insulation layer, and a layer equal in material to the magnetization fixed layer in such a manner as to overlap a second wire formed of the same layer as the first wires in plan view. The multilayer structure is disposed in such a manner as not to overlap both of a pair of the adjacent second wires in plan view in the peripheral circuit region.

A semiconductor device in accordance with another embodiment of the present invention includes the following configuration. The semiconductor device includes: a semiconductor substrate having a main surface; a memory cell region including a plurality of resistance recording elements formed over the main surface of the semiconductor substrate, and changing in electrical resistance according to the application of a voltage, disposed therein; an interlayer insulation film disposed at the same layer as the resistance recording elements; and a peripheral circuit region disposed in the periphery of the memory cell region in plan view. The resistance recording element includes a first metal electrode, an insulation film, and a second metal electrode stacked in this order. The semiconductor device includes, above the resistance recording elements, a plurality of first wires extending in the direction along the main surface, and coupled to the top surfaces of the resistance recording elements. In the peripheral circuit region, there is disposed a multilayer structure of lamination of a layer equal in material to the first metal electrode forming the resistance recording element, a layer equal in material to the insulation film, and a layer equal in material to the second metal electrode in such a manner as to overlap a second wire formed of the same layer as the first wire in plan view. The multilayer structure is disposed in such a manner as not to overlap both of a pair of the adjacent second wires in plan view in the peripheral circuit region.

A semiconductor device in accordance with a still other embodiment of the present invention includes the following configuration. The semiconductor device includes: a semiconductor substrate having a main surface; a memory cell region including a plurality of phase change recording elements formed over the main surface of the semiconductor substrate, and changing in electrical resistance according to the phase change, disposed therein; an interlayer insulation film disposed at the same layer as the phase change recording elements; and a peripheral circuit region disposed in the periphery of the memory cell region in plan view. The phase change recording element includes a first metal electrode, a phase change layer, and a second metal electrode stacked in this order. The semiconductor device includes, above the phase change recording elements, a plurality of first wires extending in the direction along the main surface, and coupled to the top surfaces of the phase change recording elements. In the peripheral circuit region, there is disposed a multilayer structure of lamination of a layer equal in material to the first metal electrode forming the phase change recording element, a layer equal in material to the phase change layer, and a layer equal in material to the second metal electrode, in such a manner as to overlap a second wire formed of the same layer as the first wire in plan view. The multilayer structure is disposed in such a manner as not to overlap both of a pair of the adjacent second wires in plan view in the peripheral circuit region.

The present embodiment reduces the possibility of a short circuit between a pair of the adjacent second wires due to the multilayer structure as a dummy pattern. For this reason, it is possible to provide a high-reliability semiconductor device in which the uppermost surface of the interlayer insulation film is further planarized, and the occurrence of a short circuit between the second wires is suppressed by the multilayer structure.

DETAILED DESCRIPTION

Below, embodiments of the present invention will be described by reference to the accompanying drawings.

First Embodiment

First, as the present embodiment, a semiconductor device in a chip state will be described by reference to FIG. 1.

Figure 1:
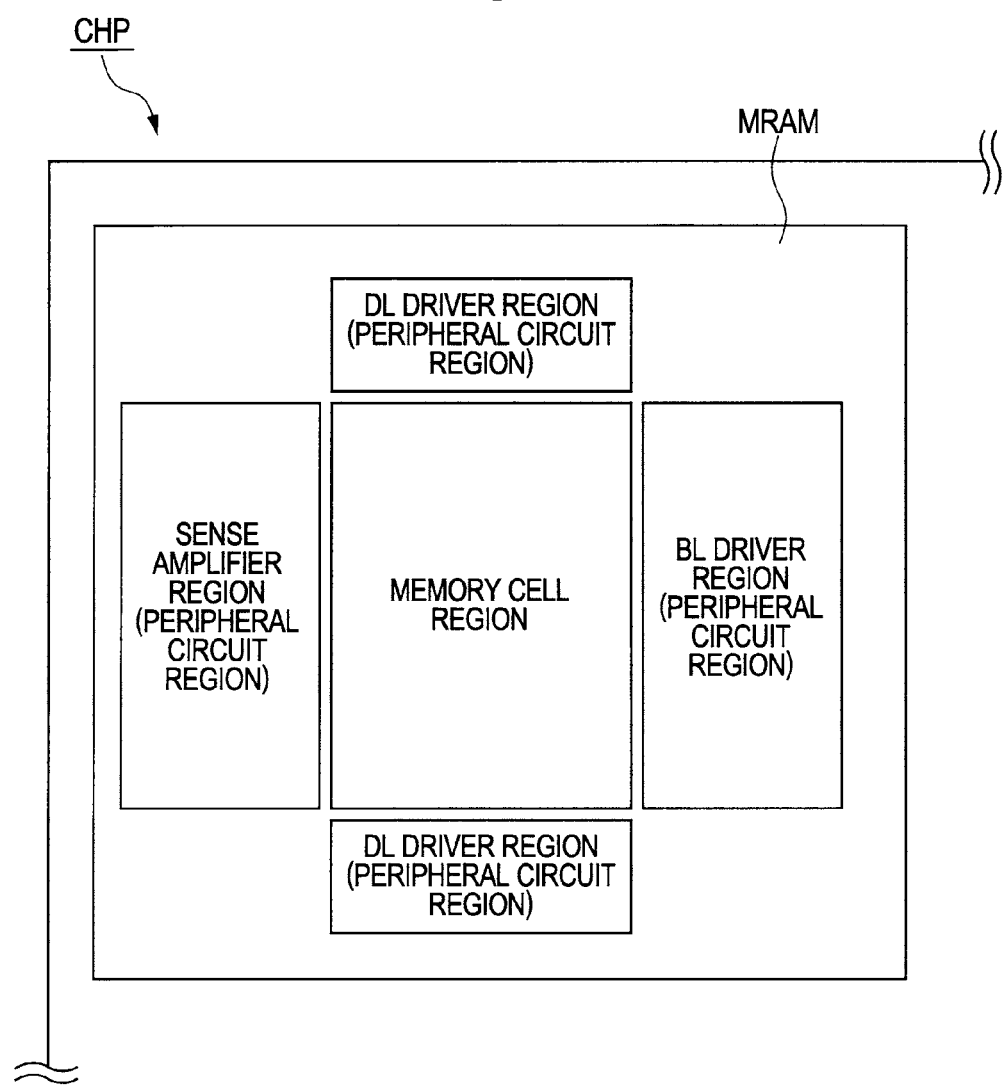
FIG. 1 is a partially schematic plan view of a semiconductor chip in accordance with a first embodiment of the present invention.

By reference to FIG. 1, a MRAM formed in a semiconductor chip CHP in the present embodiment has a memory cell region and a peripheral circuit region. Other than these, the MRAM has a CPU (Central Processing Unit) and a power line not shown, and the like. Herein, the semiconductor chip CHP is one unit of an integrated circuit formed over the main surface of a semiconductor substrate described later.

The memory cell region is intended to represent a region in which a plurality of cells (memory cells) including elements having a memory function such as MRAMs are arranged in an array over the main surface of the semiconductor chip CHP. The peripheral circuit regions are intended to represent regions other than the memory cell region over the main surface of the semiconductor chip CHP, and a region (BL driver region) in which circuits (BL driver) coupled with bit lines described later to be electrically coupled with the MRAMs in the memory cell region are disposed, and a region (sense amplifier region) in which sense amplifiers are disposed. Further, for example, a region (DL driver region) in which circuits (DL drivers) formed at the same layer as the bit lines, and coupled with other wires not coupled with the bit lines are disposed is also herein intended to be referred to as a peripheral circuit region. The wire to be coupled with the DL driver is routed upward from the layer on the bottom side of the bit line to the same layer as the bit line.

Therefore, even regions outside (as seen from the memory cell region) of the boundary part between the peripheral region including, for example, a power circuit, a clock circuit, and a reset circuit, and the memory cell region inclusive are herein defined as peripheral circuit regions. The peripheral region (the region including the power circuit, the clock circuit, the reset circuit, and the like) forms the system of the semiconductor device with MRAMs and a CPU.

FIG. 1 shows only respective one sites of the memory cell region, and the peripheral circuit regions in which the BL drivers, the DL drivers, the sense amplifiers, and the like are disposed. However, in actuality, a plurality of them are disposed over the semiconductor chip CHP.

Incidentally, the CPU is a circuit also called a central processing part, and reads and decodes a command from a storage device, and performs various operations and controls based on it. For this reason, high speed processing is required of the CPU.

The MRAM is an element capable of reading and writing stored information at random using magnetism. The MRAM is a memory element not only functioning as a nonvolatile memory in which the stored state is held even when the power is cut off, but also having a high-speed random access function.

Figure 2:
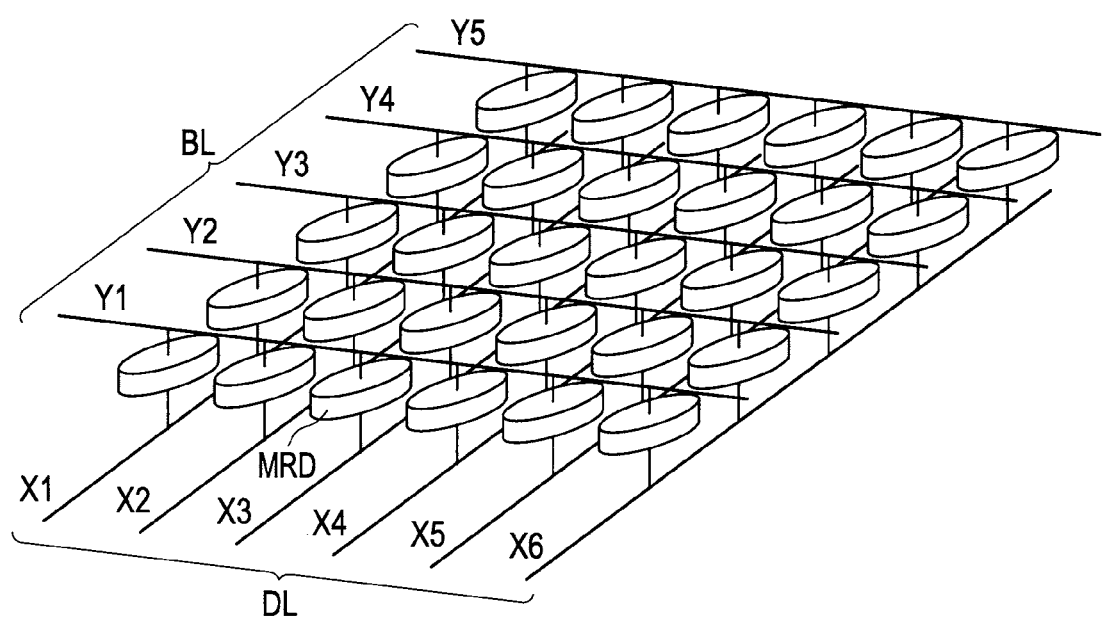
FIG. 2 is a schematic structural perspective view showing a mode in which a plurality of MRAM magnetoresistive elements are disposed in a memory cell region, and are coupled with bit lines and digit lines of an embodiment of the present invention.

Then, the MRAM in the present embodiment will be described by reference to FIG. 2. Referring to FIG. 2, in the MRAM in the present embodiment, a plurality of (in FIG. 2, five rows of) bit lines BL (Y1 to Y5) and a plurality of (in FIG. 2, 6 rows of) digit lines DL (X1 to X6) are electrically coupled with magnetoresistive elements MRD. The bit lines BL and the digit lines DL extend in the directions generally orthogonal to each other in plan view.

Then, more detailed configurations of the memory cell region and the peripheral circuit region of FIG. 1 will be described by reference to FIGS. 3 to 6.

Figure 3:
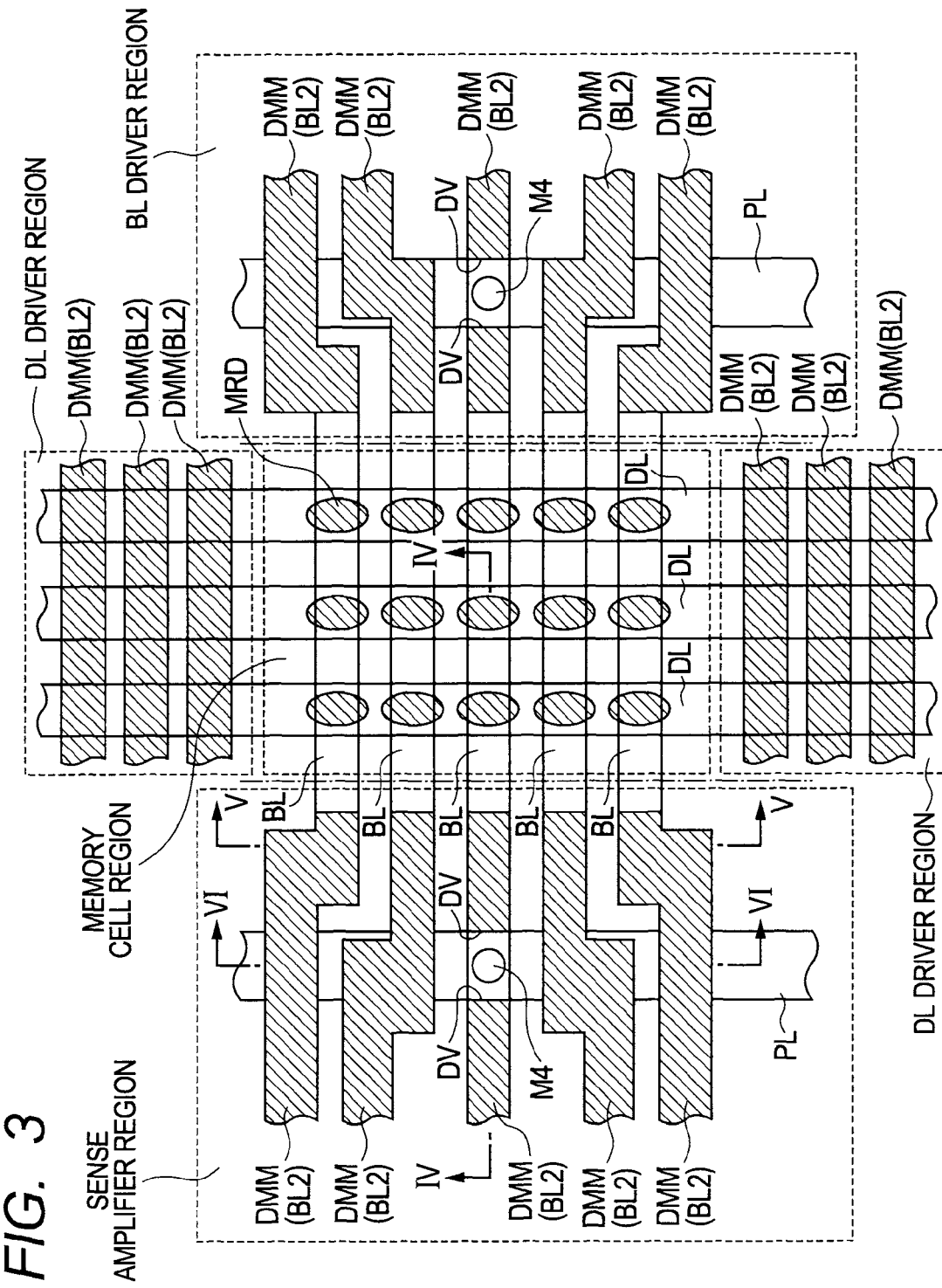
FIG. 3 is a plan view showing a layout in plan view of the magnetoresistive elements, the bit lines, the digit lines, and the like disposed in the memory cell region and the peripheral circuit region of FIG. 1.
Figure 4:
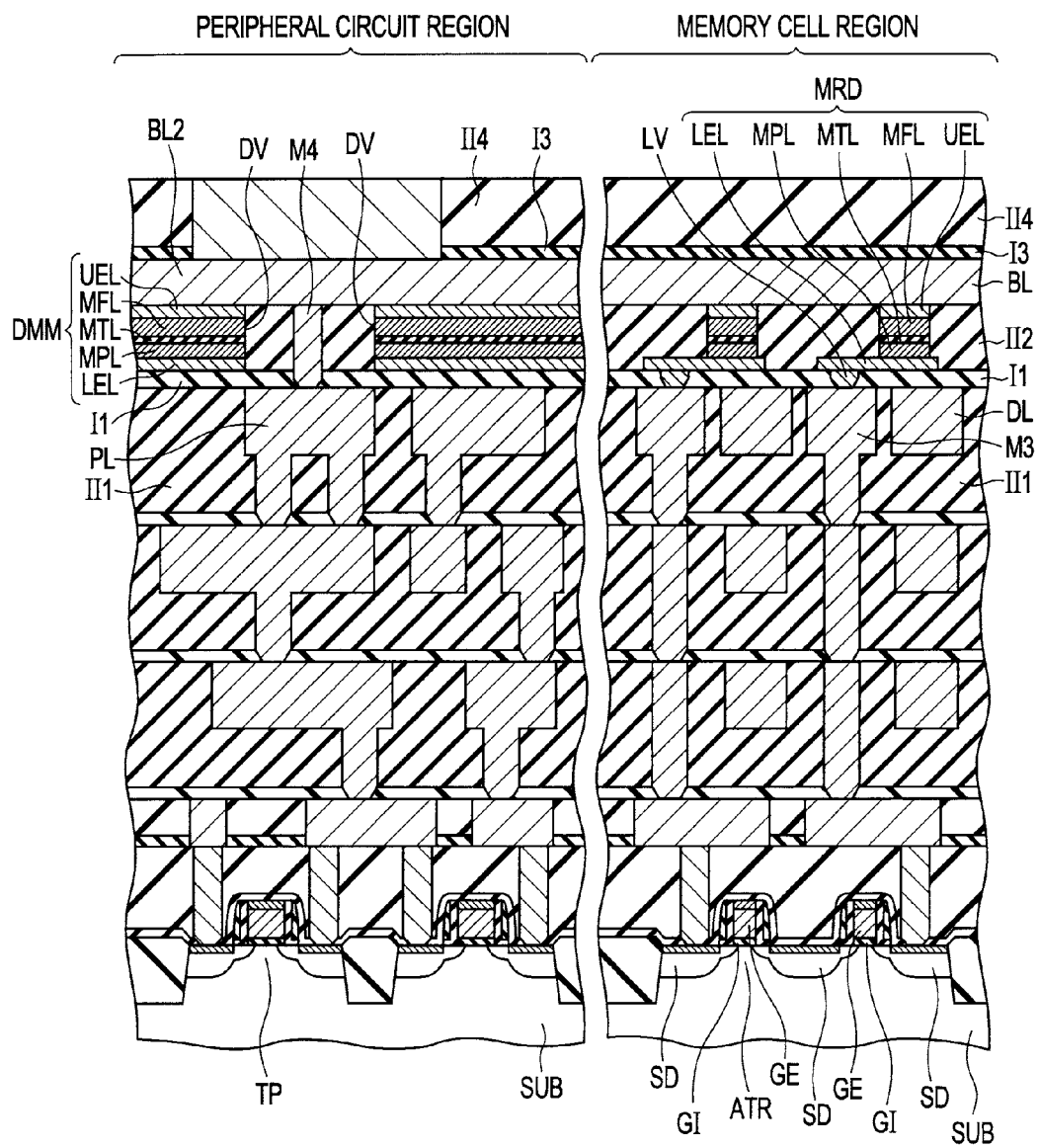
FIG. 4 is a cross-sectional view showing the memory cell region and the peripheral circuit region in the MRAM of the first embodiment of the present invention.

FIG. 3 shows a view of one memory cell region of a MRAM, and a BL driver region, a DL driver region, and a sense amplifier region in plan view. FIG. 4 is a schematic cross-sectional view of the memory cell region of MRAM and the peripheral circuit region other than the memory cell region, such as the sense amplifier region in a portion along line IV-IV of FIG. 3.

First, referring to FIG. 4, a memory cell of MRAM formed in the memory cell region of FIG. 3 has an access transistor ATR and a magnetoresistive element MRD. The access transistor ATR has a pair of source/drain regions SD which are impurity diffusion layers containing, for example, boron, phosphorus, or arsenic, a gate insulation layer GI including a silicon oxide film, and a gate electrode layer GE including a conductor such as polysilicon or a metal film. The pair of source/drain regions SD are spaced from each other over a main surface of a semiconductor substrate SUB. The gate electrode layer GE is formed over the surface of the semiconductor substrate SUB interposed between the pair of source/drain regions SD via the gate insulation layer GI. Incidentally, the surfaces of the pair of source/drain regions SD and the gate electrode layer GE may be silicided.

The magnetoresistive element MRD is situated over the main surface of the semiconductor substrate SUB over which the access transistor ATR is formed via a plurality of interlayer insulation layers (interlayer insulation layers including, for example, four layers of silicon oxide films) I11. The magnetoresistive element MRD is formed such that the bottom side thereof is in contact with the surface of the lower electrode LEL. The lower electrode LEL is electrically coupled with one of the pair of source/drain regions SD of the access transistor ATR through a local via LV, a reading wire M3, and the like. Incidentally, the local via LV is formed at the same layer as an insulation film I1 (including, for example, a silicon nitride film, or a lamination film of a silicon nitride film and a silicon oxide film stacked in this order). A digit line DL is disposed in such a manner as to be in contact with the bottom surface of the insulation film I1.

The magnetoresistive element MRD has, other than the lower electrode LEL, a pinned layer MPL (magnetization fixed layer), a tunneling insulation layer MTL, a free layer MFL (magnetization free layer), and an upper electrode UEL. In addition, the magnetoresistive element MRD has a multi-layer structure of, for example, the pinned layer MPL, the tunneling insulation layer MTL, the free layer MFL, and the upper electrode UEL stacked in this order from the bottom. The pinned layer MPL is formed in such a manner as to be in contact with the top surface of the lower electrode LEL. Further, the upper electrode UEL forms the top surface of the magnetoresistive element MRD, so that the upper electrode UEL and the bit line BL (first wire) disposed thereon are directly coupled. As a result, the upper electrode UEL and the bit line BL are electrically coupled with each other without a coupling wire interposed therebetween.

The pinned layer MPL and the free layer MFL are respectively magnetic layers having magnetism. Storage of data to the magnetoresistive element MRD is done by changes in direction of magnetization in the free layer MFL according to the direction of a current passing through the magnetoresistive element MRD.

In an individual magnetoresistive element MRD, the two magnetic layers (the pinned layer MPL and the free layer MFL) are stacked via the tunneling insulation layer MTL interposed therebetween as described above. The electrical resistance value of the magnetoresistive element MRD is changed by whether the directions of magnetization in the two magnetic layers are made the same or opposite to each other.

Specifically, the direction of magnetization in the free layer MFL of the magnetoresistive element MRD is rewritten according to the magnetic field generated by the current passed through the bit line BL and the digit line DL. However, the direction of magnetization in the pinned layer MPL is fixed irrespective of the direction of the current. For this reason, the directions of magnetization in the two magnetic layers become the same or opposite from each other according to the change in the direction of magnetization in the free layer MFL. Thus, the directions of magnetization in the magnetoresistive element MRD are read by detecting the electrical resistance changed according to the directions of magnetization in the magnetoresistive element MRD.

At the same layer as the layer at which individual magnetoresistive elements MRD are formed, an interlayer insulation layer II2 (interlayer insulation film) is disposed. The interlayer insulation layer II2 includes, for example, a silicon oxide film as with the interlayer insulation layer II1. Then, further, over the bit line BL, an insulation film I3 (including, for example, a silicon nitride film), an interlayer insulation layer II4 (including, for example, a silicon oxide film), an electrode pad, and the like are stacked. However, the wires still further over the bit line BL are not shown in the plan view of FIG. 3.

On the other hand, in the BL driver region of FIG. 3, there are formed semiconductor elements such as transistors TP for controlling the operation of the memory cell (magnetoresistive element), and the like, a peripheral wire PL and a via for electrically coupling the semiconductor elements to one another. Further, a plurality of bit lines BL extending spaced from one another (so as not to be electrically coupled to one another) in the memory cell region extend to the sense amplifier region and the BL driver region at the same layer. Those thus resulting from extension of the bit lines BL in the memory cell region are referred to as bit lines BL2 (second wires) in the peripheral circuit region (the sense amplifier region and the BL driver region).

Independently of the bit lines BL2 in the sense amplifier region and the BL driver region, resulting from extension of the bit lines BL in the memory cell region to the peripheral circuit regions, a plurality of bit lines BL2 also extend spaced from one another (so as not to be electrically coupled to one another) in the DL driver region.

Referring to FIGS. 3 and 4, in the peripheral circuit region (the sense amplifier region on the left-hand side of FIG. 3) into which the bit lines BL in the memory cell region extend, dummy multilayer structures DMM (multilayer structures) are disposed at the same (the interlayer insulation layer II2 equivalent) layer as the layer at which the interlayer insulation layer II2 and the magnetoresistive elements MRD are disposed in the memory cell region. Each dummy multilayer structure DMM is disposed under its corresponding bit line BL2 in such a manner as to overlap the bit line BL2 in plan view (in such a manner as to be in the same planar shape as that of the bit line BL2). Namely, the dummy multilayer structure DMM has the shape extending along the bit line BL2. Particularly, in the present embodiment, the dummy multilayer structure DMM is disposed in such a manner as to overlap the entire surface of the bit line BL2 in plan view (so that the dummy multilayer structure DMM has roughly the same shape and size as those of the bit line BL2 in plan view). The dummy multilayer structure DMM overlapping the bit line BL2 in the BL driver region on the right-hand side of FIG. 3 in plan view also has the same configuration as that of the bit line BL2 in the sense amplifier region.

The dummy multilayer structure DMM preferably has a multilayer structure in which the layers of the same materials as those of respective layers forming the magnetoresistive element MRD are stacked. Namely, preferably, a lower electrode equivalent layer LEL, a pinned equivalent layer MPL, a tunneling equivalent layer MFL, a free equivalent layer MFL, and an upper electrode equivalent layer UEL are stacked in this order so as to have the same thicknesses as those of their respective corresponding films of the magnetoresistive element MRD, respectively.

As described up to this point, the dummy multilayer structure DMM is disposed in such a manner as to overlap the bit line BL2 in plan view. As a result, the dummy multilayer structure DMM is disposed in such a manner as not to overlap both of a pair of bit lines BL2 adjacent to each other in plan view. Namely, each dummy multilayer structure DMM is disposed in such a manner as not to be coupled to both of a pair of bit lines BL2 adjacent to each other in plan view (in such a manner as not to extend over both of the pair of bit lines BL2).

In the peripheral circuit regions in which the DL drivers are disposed (the peripheral circuit regions on the top side and the bottom side of the memory cell region of FIG. 3) irrelevant to the bit lines BL in the memory cell region, the bit lines BL2 (second wires) are disposed at the same layer as the bit lines BL. The bit line BL2 in the DL driver region is discontinuous to the bit line BL in the memory cell region. However, preferably, the bit line BL2 is made of the same material as that for the bit line BL, and has the same thickness as that of the bit line BL.

Also in the DL driver region, as with the sense amplifier region and the BL driver region, each dummy multilayer structure DMM is disposed under each bit line BL2 in such a manner as to overlap the bit line BL2 in plan view (in such a manner as to be in the same planar shape as that of the bit line BL2). Therefore, the multilayer structure DMM is also disposed in such a manner as not to be coupled to both of a pair of bit lines BL2 adjacent to each other in plan view (in such a manner as not to extend over both of the pair of bit lines BL2).

The dummy multilayer structure DMM in the DL driver region has the same multilayer structure as that of the dummy multilayer structure DMM in the BL driver region or the sense amplifier region.

Referring to FIGS. 3 and 4, in the peripheral circuit regions (in all the sense amplifier region, the BL driver region, and the DL driver region), in the interlayer insulation layer II2, a dummy via DV is formed. An interlayer coupling wire M4 (coupling wire) is formed in such a manner as to pass through the dummy via DV. However, the dummy via in the DL driver region is not shown. The interlayer coupling wire M4 is disposed in such a manner as to couple the peripheral wire PL with the bit line BL2.

Namely, the dummy multilayer structure DMM has a shape extending in such a manner as to be along the bit line BL2. However, in such a manner as not to overlap a region overlapping the interlayer coupling wire M4 in plan view, the dummy via DV is formed. Such a configuration enables an electrical coupling between the bit line BL2 and the underlying wire with the interlayer coupling wire M4 interposed therebetween, and can suppress a short circuit between the interlayer coupling wire M4 and a conductive thin film forming the dummy multilayer structures DMM.

Figure 5:
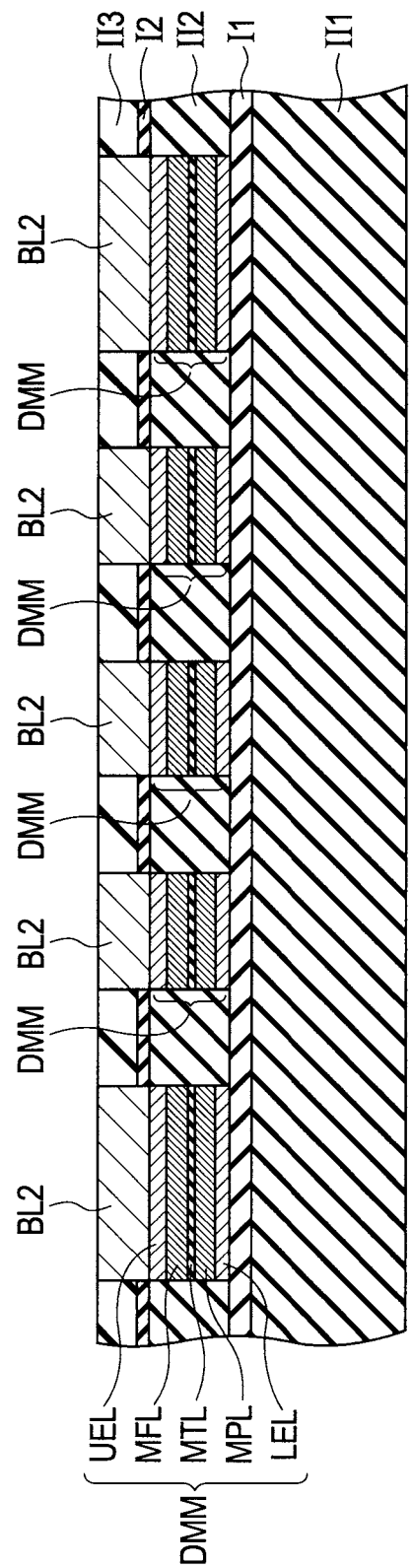
FIG. 5 is a schematic cross-sectional view at a portion along line V-V of FIG. 3.
Figure 6:
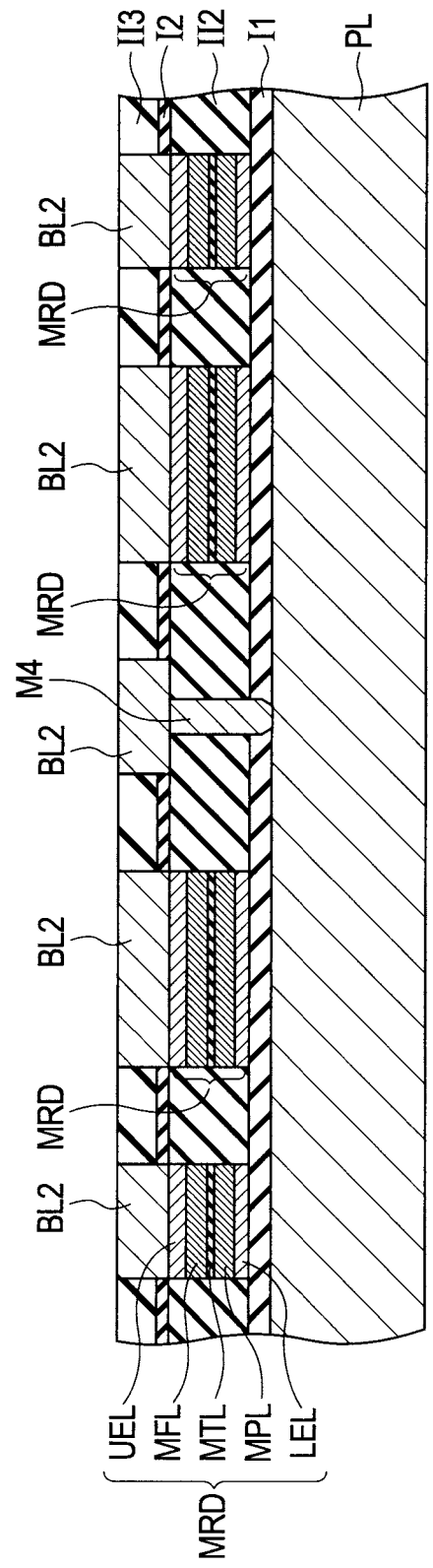
FIG. 6 is a schematic cross-sectional view at a portion along line VI-VI of FIG. 3.

FIG. 5 shows a schematic cross section in a region in which the dummy via DV and the interlayer coupling wire M4 are not disposed of the peripheral circuit regions (e.g., the sense amplifier region). FIG. 6 shows a schematic cross section in the region in which the dummy via DV and the interlayer coupling wire M4 are disposed of the peripheral circuit regions (e.g., the sense amplifier region). Further, FIGS. 5 and 6 show only the layer in which the reading wire M3 and the peripheral wire PL are disposed, and the overlying layers in FIG. 4.

Referring to FIGS. 5 and 6, at the same layer as the bit lines BL2 in the peripheral circuit region, around the bit lines BL2 in plan view, there are disposed an insulation film I2 including, for example, a silicon nitride film, and an interlayer insulation layer II3 including, for example, a silicon oxide film.

Incidentally, in each of FIGS. 4 to 6, at the wires such as the digit lines DL, the wires M3, and the bit lines BL (BL2), a cladding layer is preferably formed in such a manner as to cover each sidewall thereof and each top surface thereof (or each bottom surface thereof). Whereas, at the local via LV, the peripheral wire PL, and respective coupling wires under the wire M3, a barrier metal is preferably formed in such a manner as to cover each sidewall thereof and each top surface thereof (or each bottom surface thereof). However, herein, respective films are not shown.

Herein, the barrier metal is a film for suppressing the diffusion of metal materials forming respective wires to the outside. There is preferably used a non-magnetic tantalum thin film, or TaN obtained by adding nitrogen thereto (tantalum nitride).

The cladding layer is a film having a function of shielding against magnetic field, and preferably has, for example, a configuration in which a thin film of a soft magnetic material with a high magnetic permeability and a very low residual magnetization is interposed between barrier metals. As the thin films of the soft magnetic material, specifically, there are preferably used alloys or amorphous alloys such as NiFe (iron nickel), NiFeMo, CoNbZr (cobalt niobium zirconium), CoFeNb, CoFeSiB, CoNbRu, CoNbZrMoCr, and CoZrCrMo.

Further, in each of FIGS. 4 to 6, particularly, each sidewall of respective films having a magnetism such as the pinned layer MPL and the free layer MFL, and the tunneling insulation layer MTL of the magnetoresistive element MRD is preferably covered with a protective layer formed at relatively low temperatures such as a silicon nitride film. However, the protective layer is also herein not shown.

Then, the materials and the film thicknesses of respective parts will be described. The pinned layer MPL is preferably a thin film including a ferromagnetic layer. Specifically, the pinned layer MPL is preferably a film of a metal simple substance or an alloy including one or more selected from the group consisting of Pt (platinum), Mn (manganese), Ni (nickel), Co (cobalt), Fe (iron), B (boron), and Ru (ruthenium). Further, the pinned layer MPL is shown as a single layer in FIGS. 4 to 6. However, in general, for the pinned layer MPL, there is used a two-layer structure in which a ferromagnetic layer is stacked over an antiferromagnetic layer, a four-layer structure in which a ferromagnetic layer, a non-magnetic layer, and a ferromagnetic layer are stacked in this order over an antiferromagnetic layer, a five-layer structure, or the like. However, the number of stacked layers, and the order of the films to be stacked are not limited thereto. The overall thickness of the pinned layer MPL is preferably 50 nm or more and 100 nm or less.

The tunneling insulation layer MTL is preferably an insulation film including any of $AlO_x$ (aluminum oxide), MgO (magnesium oxide), and HfO (hafnium oxide). The thickness is preferably 0.5 nm or more and 2.0 nm or less, and especially, more preferably 0.6 nm or more and 1.5 nm or less.

The free layer MFL is a thin film including a ferromagnetic layer. In addition, a material having a high etching selectivity with respect to a silicon oxide film is preferably used. Specifically, the free layer MFL is preferably a film of a metal simple substance or an alloy including one or more selected from the group consisting of Ni (nickel), Co (cobalt), Fe (iron), B (boron), and Ru (ruthenium). Alternatively, a plurality of thin films including the alloys of the different materials may be stacked. The overall thickness is preferably 2.0 nm or more and 10 nm or less, and more preferably 3.0 nm or more and 9.0 nm or less.

The lower electrode LEL preferably includes a metal film of, for example, Ta (tantalum), TaN (tantalum nitride), Ru, or TiN (titanium nitride). Further, the lower electrode LEL may be a single layer, or may includes a plurality of thin films including the different materials. The thickness of the lower electrode LEL is preferably 10 nm or more and 70 nm or less, and especially, preferably, 20 nm or more and 50 nm or less (as one example, 35 nm).

The upper electrode UEL preferably includes a metal material having a high etching selectivity with respect to a silicon oxide film, such as Ta, TaN, Ru, or TiN. The upper electrode UEL may also be a single layer, but may include a plurality of thin films including the different materials. The thickness of the upper electrode UEL is preferably, for example, 60 nm or more and 70 nm or less. Further, in the case of the upper electrode UEL including, for example, 2 layers stacked one over another, the thickness of the lower part of the upper electrode UEL is preferably, for example, 30 nm or more and 70 nm or less. Especially, the thickness is preferably 35 nm or more and 65 nm or less (as one example, 60 nm). Whereas, the thickness of the upper part of the upper electrode UEL is preferably, for example, 5 nm or more and 100 nm or less. As one example, there can be considered the upper electrode UEL in which a thin film including Ta and having a thickness of 60 nm is stacked over a thin film including Ru and having a thickness of 7.5 nm.

Further, various wires, namely, the wires M3 and M4, the bit line BL (BL2), and the digit line DL each preferably include a thin film made of, for example, copper. The local via LV is preferably formed of, for example, a tungsten film.

In the above description, a general MRAM was described. However, the present embodiment is also applicable to a so-called STT (Spin Transfer Torque)-MRAM not having a digit line, and changing in direction of magnetization according to the direction of a current between the bit line BL and the access transistor ATR. Herein, the STT-MRAM will be described by reference to FIG. 7.

Figure 7:
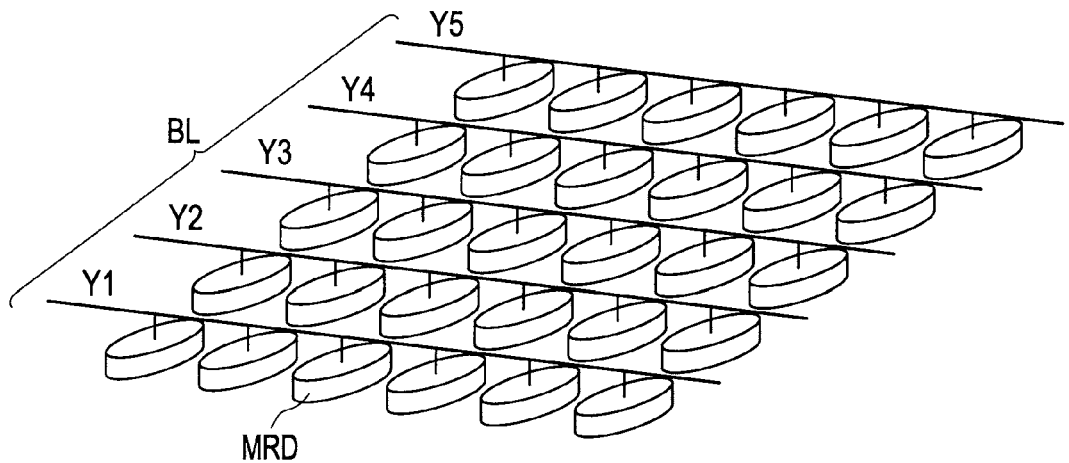
FIG. 7 is a schematic structural perspective view showing a mode in which a plurality of STT-MRAM magnetoresistive elements are disposed in a memory cell region, and are coupled with bit lines as a modified example of the first embodiment of the present invention.

Referring to FIG. 7, in the STT-MRAM, a plurality of (in FIG. 10, 5 rows of) bit lines BL (Y1 to Y5) are electrically coupled with the magnetoresistive elements MRD. However, the digit line disposed in a general MRAM is not disposed. In this respect, the STT-MRAM is different from a general MRAM. Further, in the STT-MRAM, generally, a cladding layer is not formed.

Also in the STT-MRAM, as with a general MRAM, in each magnetoresistive element MRD, as described above, two magnetic layers (a pinned layer MPL and a free layer MFL) are stacked with a tunneling insulation layer MTL interposed therebetween. By making the directions of magnetization in the two magnetic layers the same or opposite to each other, the electrical resistance value of the magnetoresistive element MRD is changed.

Specifically, the direction of magnetization in the free layer MFL of the magnetoresistive element MRD is rewritten according to the direction of a current passed through a current path from the bit line BL through the magnetoresistive element MRD to the access transistor ATR. However, the direction of magnetization in the pinned layer MPL is fixed irrespective of the direction of the current. For this reason, the directions of magnetization in the two magnetic layers become the same or opposite to each other according to a change in direction of magnetization in the free layer MFL. Thus, by detecting the electrical resistance changed according to the directions of magnetization in the magnetoresistive element MRD, the directions of magnetization in the magnetoresistive element MRD are read.

Then, a method for manufacturing a MRAM shown in FIGS. 3 to 6 as a semiconductor device of the present embodiment will be described by reference to FIGS. 8 to 22. Incidentally, FIGS. 8 to 22 show the memory cell region, and as one example, the peripheral circuit region of the sense amplifier. Further, FIGS. 8 to 22 each show the same cross section as the cross section shown in FIG. 4.

Figure 8:
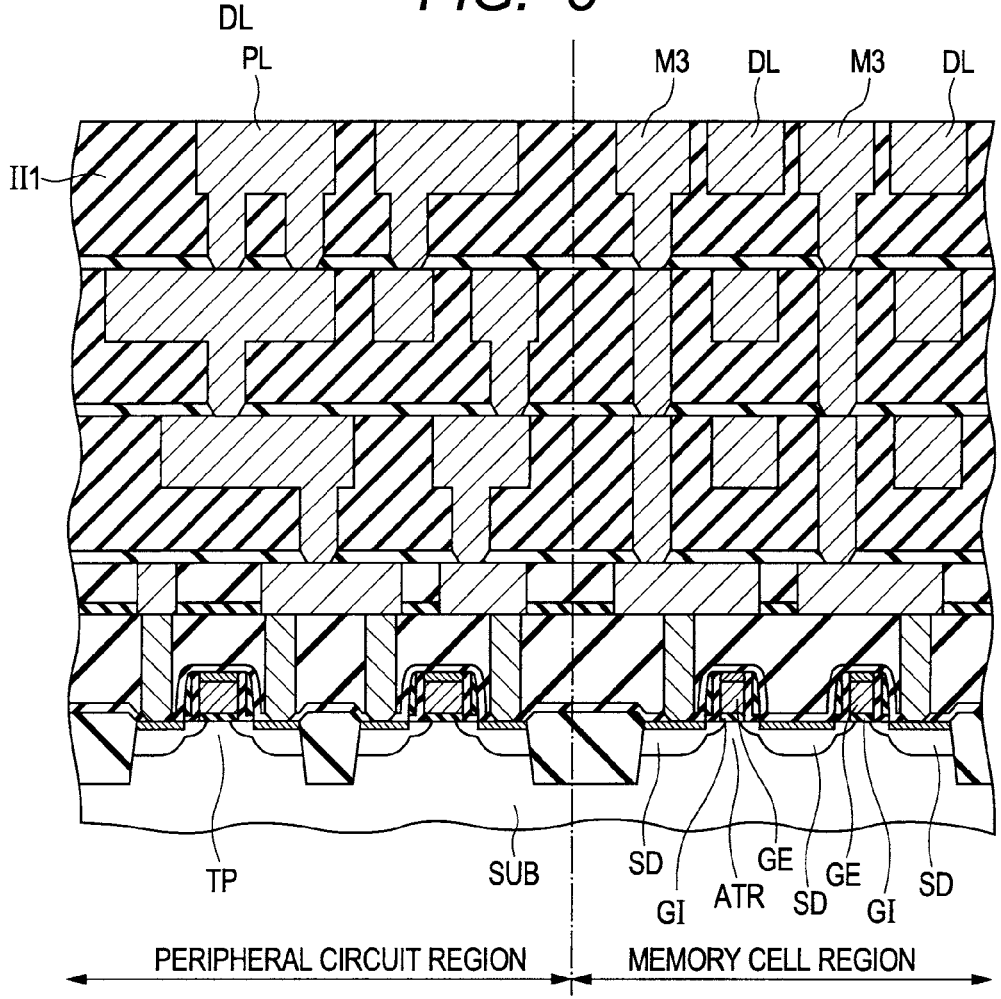
FIG. 8 is a cross-sectional view showing one step of a method for manufacturing the memory cell region and the peripheral circuit region in the MRAM of the first embodiment of the present invention.
Figure 9:
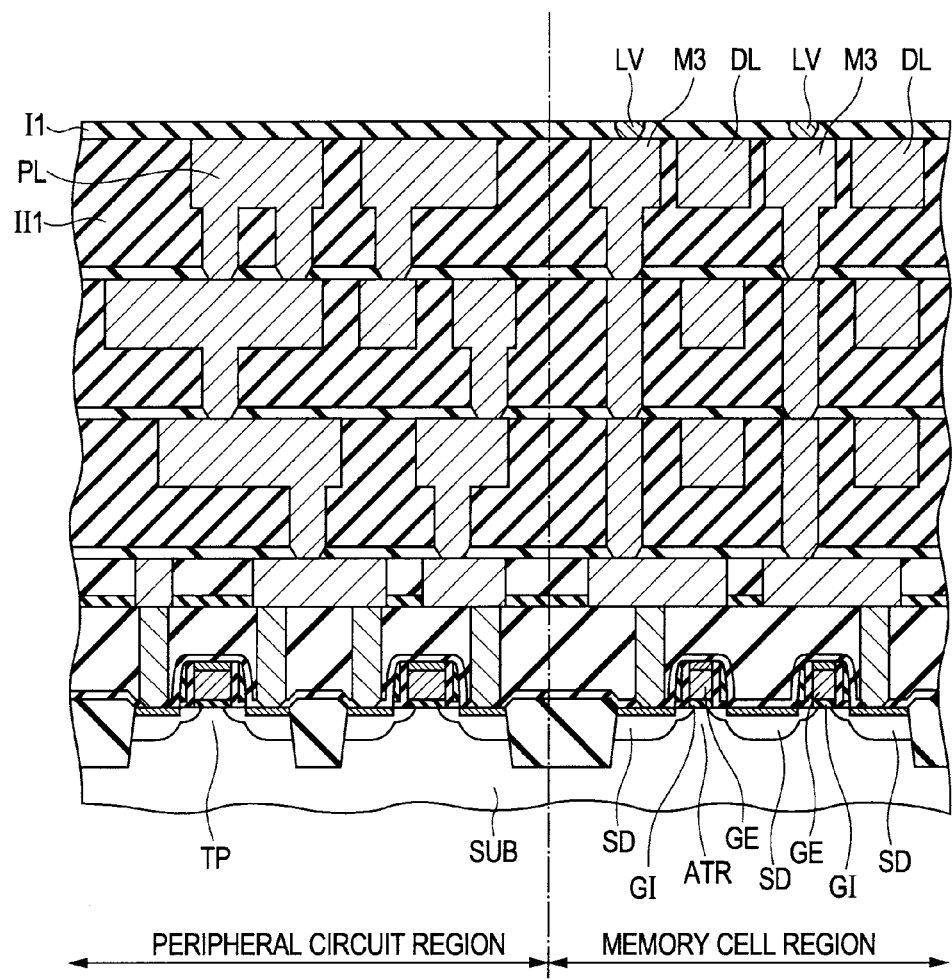
FIG. 9 is a cross-sectional view showing a step performed after the step shown in FIG. 8 in the first embodiment of the present invention.

Referring to FIG. 8, over the main surface of the semiconductor substrate SUB, respective prescribed transistors ATR and TP, wires, and the like are formed. Then, referring to FIG. 9, over the wires M3 and PL, the insulation film I1 including, for example, a silicon nitride film is formed. Then, by a general photomechanical process technology and etching, a local via hole is formed as a hole passing through the insulation film I1 over the wire M3, and exposing the reading wire M3. The resist pattern (not shown) used for the photomechanical process technology is removed by, for example, asking. Then, a barrier metal (not shown) is formed over the silicon nitride film I1 in such a manner as to cover the bottom surface and the sidewall of the local via hole. A tungsten film is formed thereover.

The tungsten film and the barrier metal are subjected to a chemical mechanical polishing processing. As a result, the tungsten film and the barrier metal are polished and removed until the top surface of the silicon nitride film I1 is exposed. Then, in the local via hole, the barrier metal and the tungsten film are left, so that the local via LV including the barrier metal and the tungsten film is formed. Further, the top surface of the silicon nitride film I1 is planarized by the chemical mechanical polishing processing.

Figure 10:
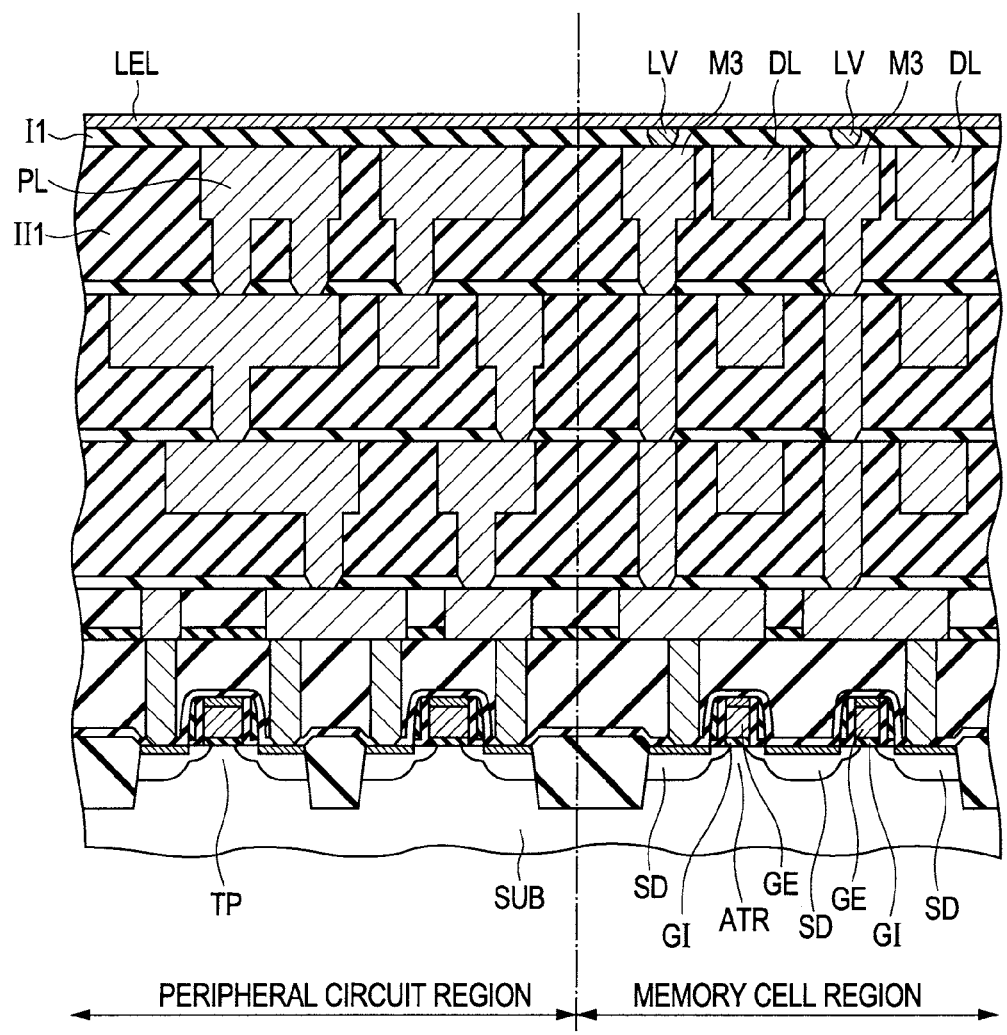
FIG. 10 is a cross-sectional view showing a step performed after the step shown in FIG. 9 in the first embodiment of the present invention.

Referring to FIG. 10, over the silicon nitride film I1, there is formed a prescribed film LEL to be a lower electrode.

Below, FIGS. 11 to 13 each show a first processing method at the time of formation of the prescribed film LEL of FIG. 10, or later. FIGS. 14 to 18 each show a second processing method at the time of formation of the prescribed film LEL of FIG. 10, or later.

Figure 11:
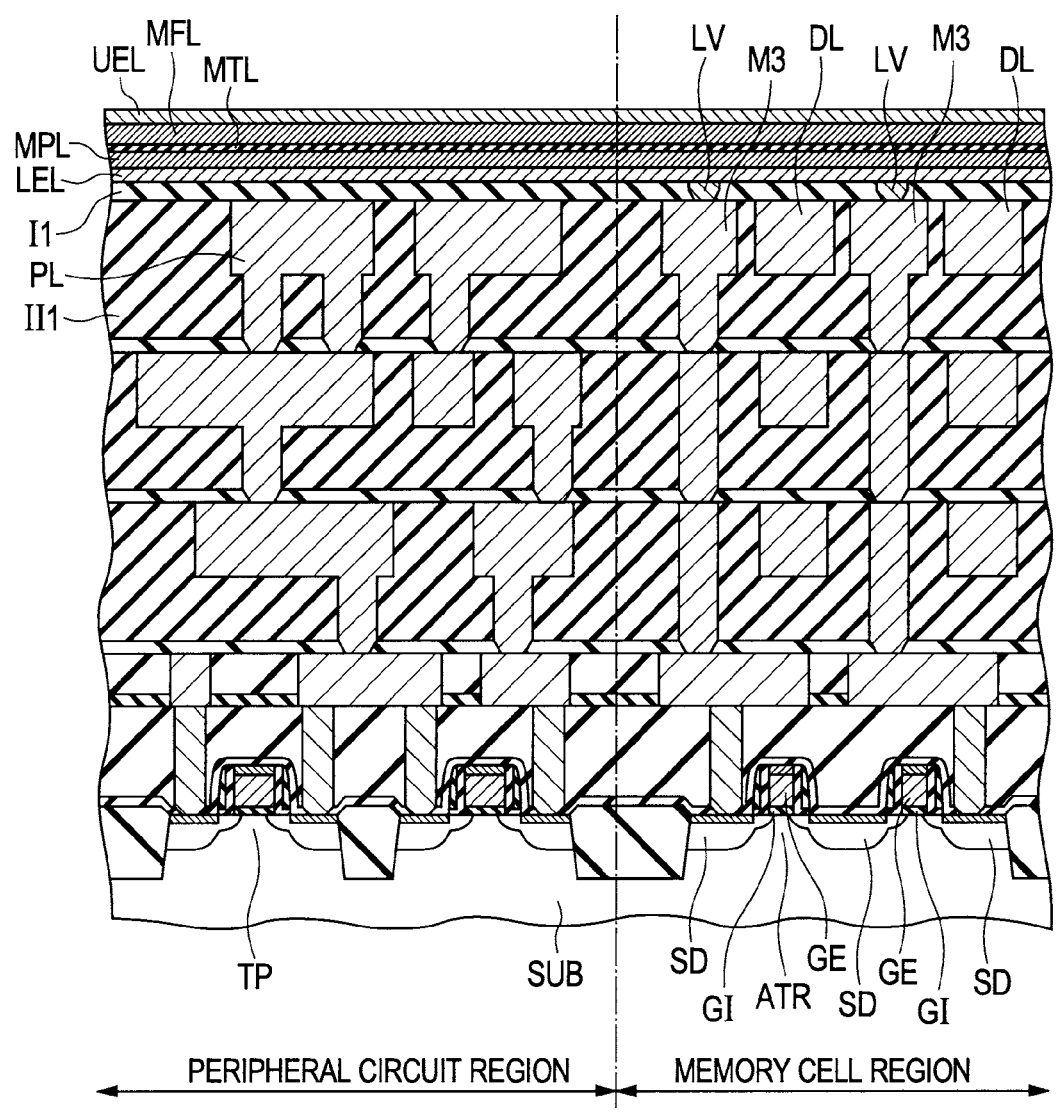
FIG. 11 is a cross-sectional view showing a first example of a step performed after the step shown in FIG. 10 in the first embodiment of the present invention.

Referring to FIG. 11, over the prescribed film LEL to be the lower electrode, there is formed a prescribed film to be the pinned layer MPL. As the prescribed film, there is formed a lamination film containing one, or a plurality of, for example, Pt, Mn, Ni, Ru, Co, Fe, and B. Then, over the prescribed film to be the pinned layer MPL, there is formed a prescribed film to be the tunneling insulation layer MTL. Then, over the prescribed film to be the tunneling insulation layer MTL, there is formed a prescribed film to be the free layer MFL. As the prescribed film, there is formed an alloy film containing at least two metals of, for example, Ni, Fe, Co, and B. Then, over the prescribed film to be the free layer MFL, there is formed a prescribed film to be the upper electrode UEL. As the prescribed film to be the upper electrode UEL, there can be considered, for example, a configuration of lamination of a thin film including Ru and having a thickness of 7.5 nm, and a thin film including Ta and having a thickness of 60 nm stacked over the thin film.

Figure 12:
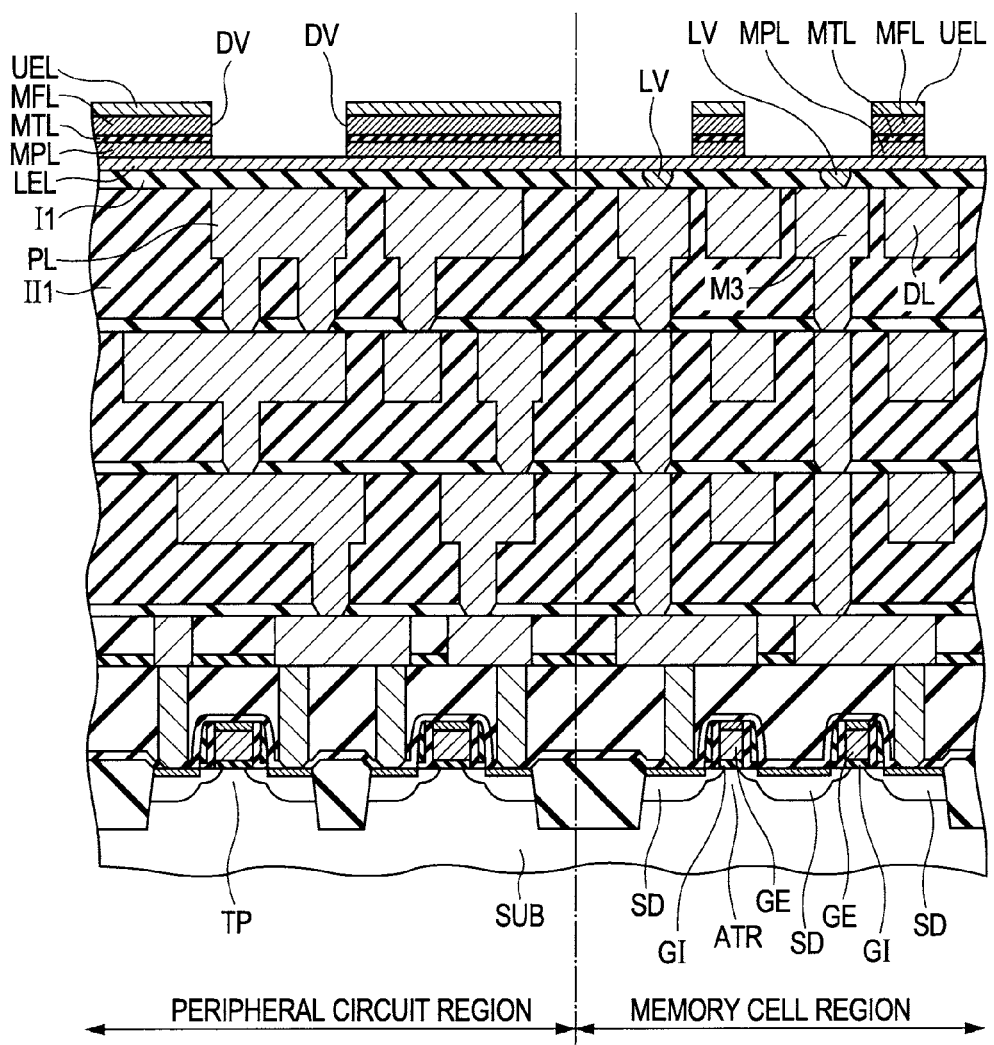
FIG. 12 is a cross-sectional view showing a step performed after the step shown in FIG. 11 in the first embodiment of the present invention.

Referring to FIG. 12, with a resist pattern (not shown) for patterning a magnetoresistive element by a general photomechanical process technology and etching, over the prescribed film to be the upper electrode UEL as a mask, the prescribed film to be the upper electrode UEL is etched into a prescribed shape. Then, the resist pattern is removed by, for example, asking. Then, with the upper electrode UEL as a mask, the prescribed film to be the free layer MFL, the prescribed film to be the tunneling insulation layer MTL, and the prescribed film to be the pinned layer MPL are etched under prescribed conditions.

By the etching, respective films are patterned. As a result, in the memory cell region, there are formed the pinned layer MPL, the tunneling insulation layer MTL, the free layer MFL, and the upper electrode UEL. Whereas, in the peripheral circuit region, there are formed the pinned equivalent layer MPL, the tunneling equivalent layer MTL, the free equivalent layer MFL, and the upper electrode equivalent layer UEL. Incidentally, in respective manufacturing processes after the formation of the magnetoresistive element MRD, in order to particularly protect the tunneling insulation layer MTL of the magnetoresistive element MRD, various processings are performed under temperatures of 300° C. or less.

Incidentally, herein, the upper electrode UEL and the like in the memory cell region are preferably patterned so as to be formed in a region generally overlapping the digit line DL in plan view. Whereas, preferably, the upper electrode equivalent layer UEL and the like in the peripheral circuit region are formed in a region generally overlapping the region in which the bit lines BL are formed in plan view, and are formed in such a manner as not to overlap both of the adjacent bit lines BL (in such a manner as not to extend over both).

Then, for the purpose of protecting, particularly, the pinned layer MPL, the tunneling insulation layer MTL, and the free layer MFL of the magnetoresistive element MRD, there is formed a protective layer (not shown) covering each sidewall of the respective films. The protective layer includes, for example, a silicon nitride film. Using a mixed atmosphere of, for example, a $SiH_4$ (silane) gas, a $H_2$ (hydrogen) gas, and a He (helium) gas, heating is performed to 300° C. or less, for example, 275° C. with a CVD (Chemical Vapor Deposition) method, thereby to form the protective layer.

Figure 13:
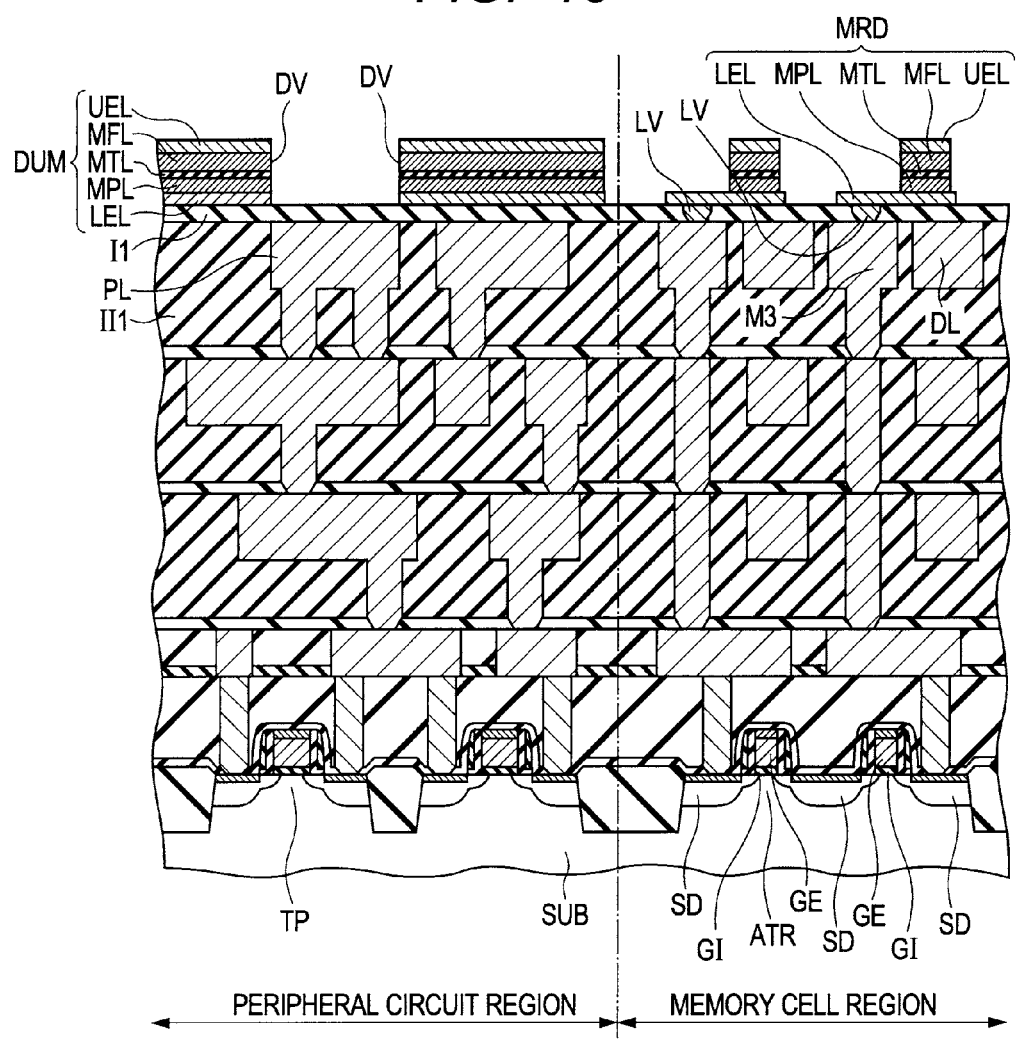
FIG. 13 is a cross-sectional view showing a step performed after the step shown in FIG. 12 in the first embodiment of the present invention.

Referring to FIG. 13, with the same photomechanical process technology and etching by a general resist pattern, as described above, in the memory cell region, the protective layer and the lower electrode LEL are formed. Further, by the processing, in the peripheral circuit region, the lower electrode equivalent layer LEL is formed. By the procedure up to this point, in the memory cell region, the magnetoresistive element MRD is formed from respective films of the lower electrode LEL, the pinned layer MPL, the tunneling insulation layer MTL, the free layer MFL, and the upper electrode UEL. Whereas, in the peripheral circuit region, the dummy multilayer structure DMM is formed from respective films of the lower electrode equivalent layer LEL, the pinned equivalent layer MPL, the tunneling equivalent layer MTL, the free equivalent layer MFL, and the upper electrode equivalent layer UEL. Of the region interposed between the adjacent dummy multilayer structures DMM in the peripheral circuit region, a region in which an interlayer coupling wire M4 is formed in a post step is formed as a dummy via DV.

Figure 14:
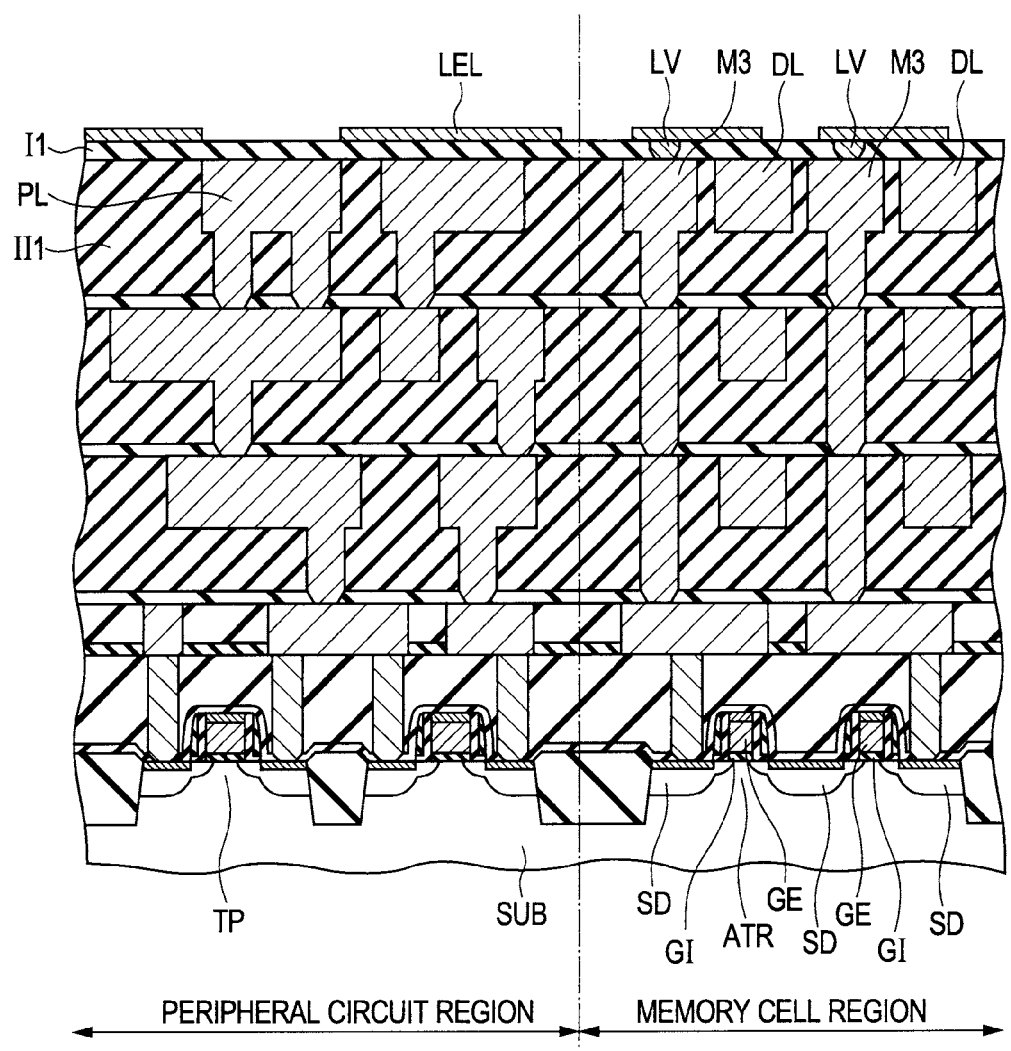
FIG. 14 is a cross-sectional view showing a second example of a step performed after the step shown in FIG. 10 in the first embodiment of the present invention.

Alternatively, after performing the step shown in FIG. 10, the following step may be performed in place of the step shown in FIG. 11. Referring to FIG. 14, with a resist pattern (not shown) for patterning a magnetoresistive element by a general photomechanical process technology and etching, over the prescribed film to be the lower electrode LEL as a mask, the prescribed film to be the lower electrode LEL is etched into a prescribed shape. By this processing, the film is patterned. In the memory cell region, the lower electrode LEL is formed. In the peripheral circuit region, the lower electrode equivalent layer LEL is formed.

Figure 15:
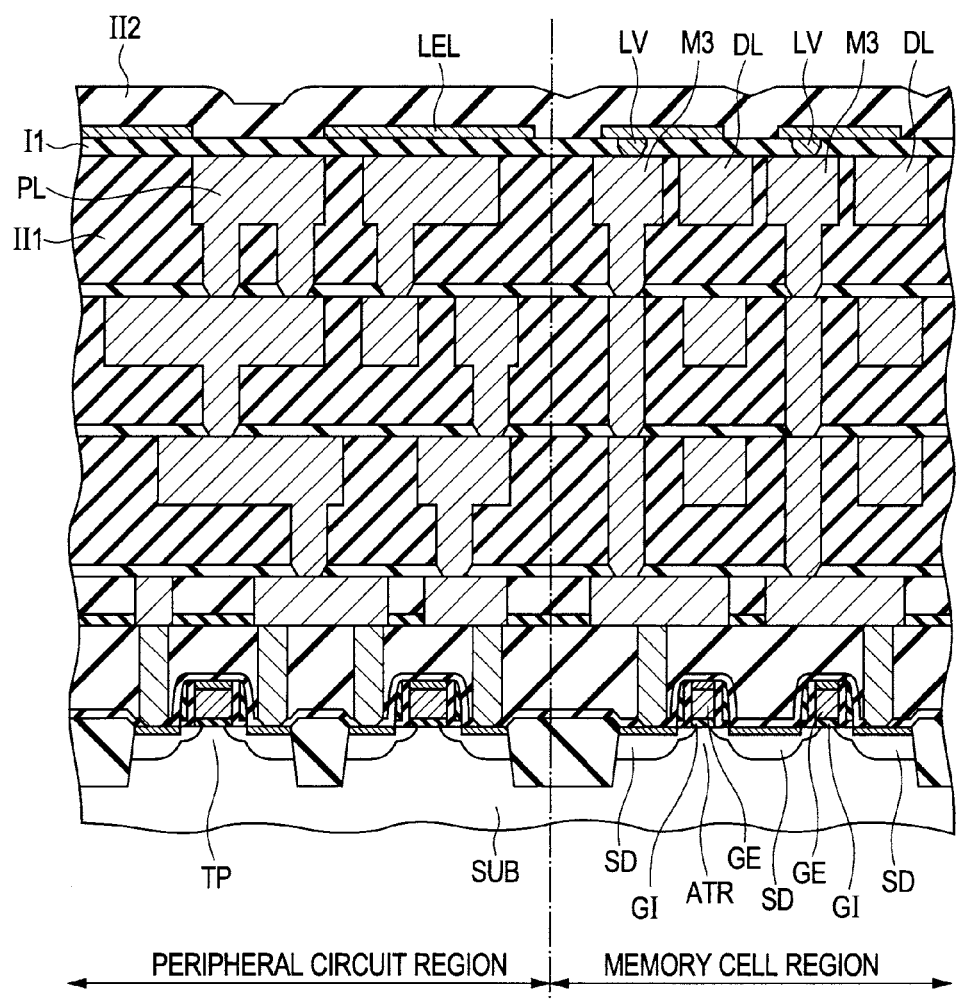
FIG. 15 is a cross-sectional view showing a step performed after the step shown in FIG. 14 in the first embodiment of the present invention.
Figure 16:
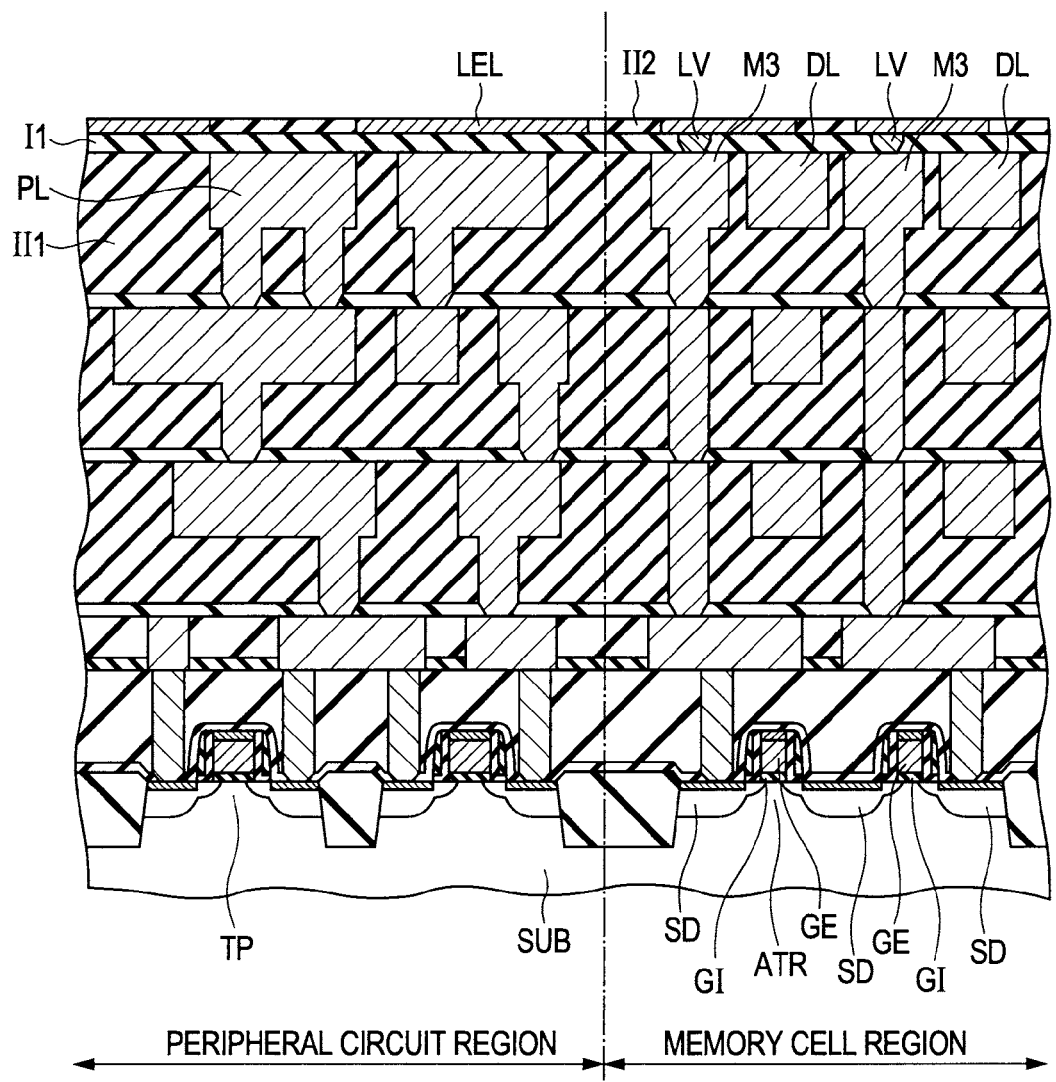
FIG. 16 is a cross-sectional view showing a step performed after the step shown in FIG. 15 in the first embodiment of the present invention.

Referring to FIG. 15, a silicon oxide film II2 is formed in such a manner as to cover the lower electrode (lower electrode equivalent layer) LEL. Referring to FIG. 16, the silicon oxide film II2 is subjected to a chemical mechanical polishing processing. As a result, the silicon oxide film II2 is polished and removed until the top surface of the lower electrode (lower electrode equivalent layer) LEL is exposed. By this processing, the top surfaces of the lower electrodes (lower electrode equivalent layers) LEL and the silicon oxide film II2 interposed therebetween are planarized.

Figure 17:
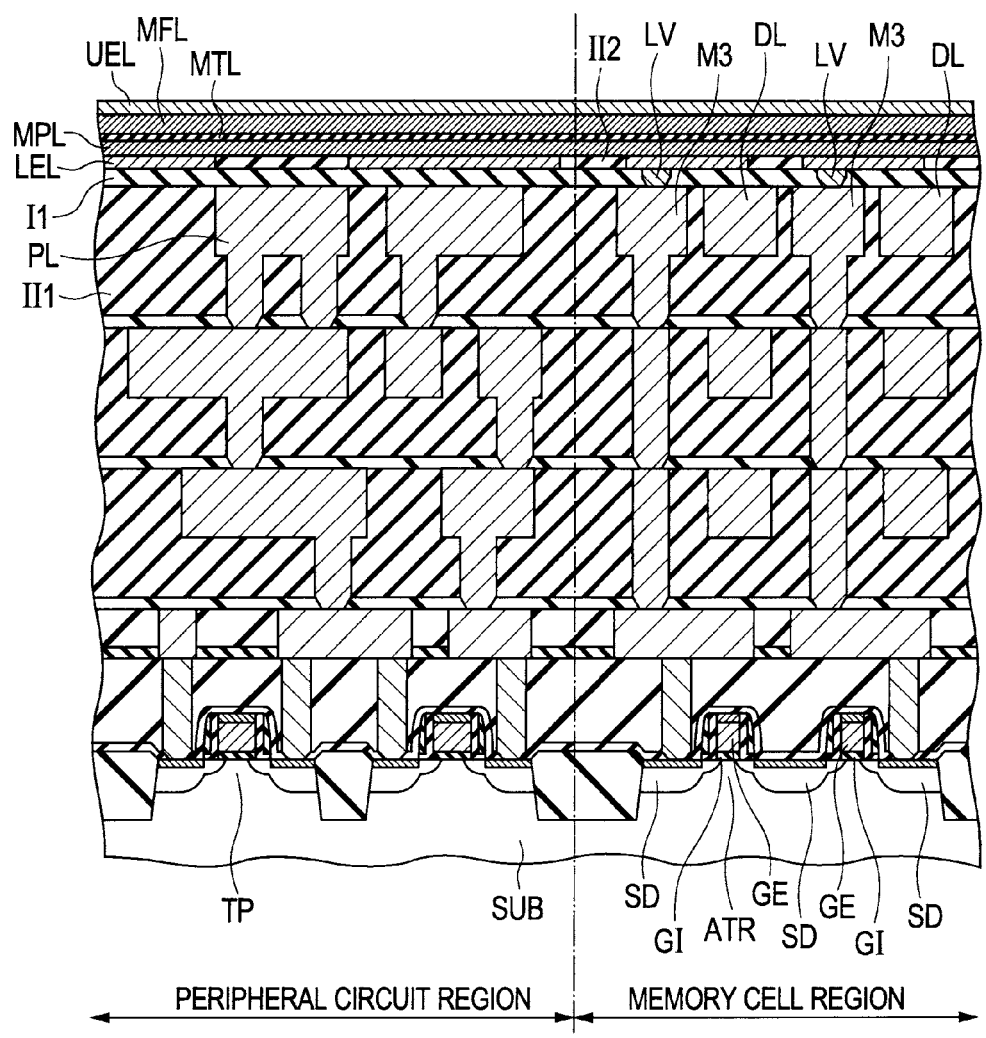
FIG. 17 is a cross-sectional view showing a step performed after the step shown in FIG. 16 in the first embodiment of the present invention.

Referring to FIG. 17, over the lower electrode LEL (lower electrode equivalent layer) and the silicon oxide film II2, as with the step shown in FIG. 11, a prescribed film to be the pinned layer MPL, a prescribed film to be the tunneling insulation layer MTL, a prescribed film to be the free layer MFL, and a prescribed film to be the upper electrode UEL are stacked in this order.

Figure 18:
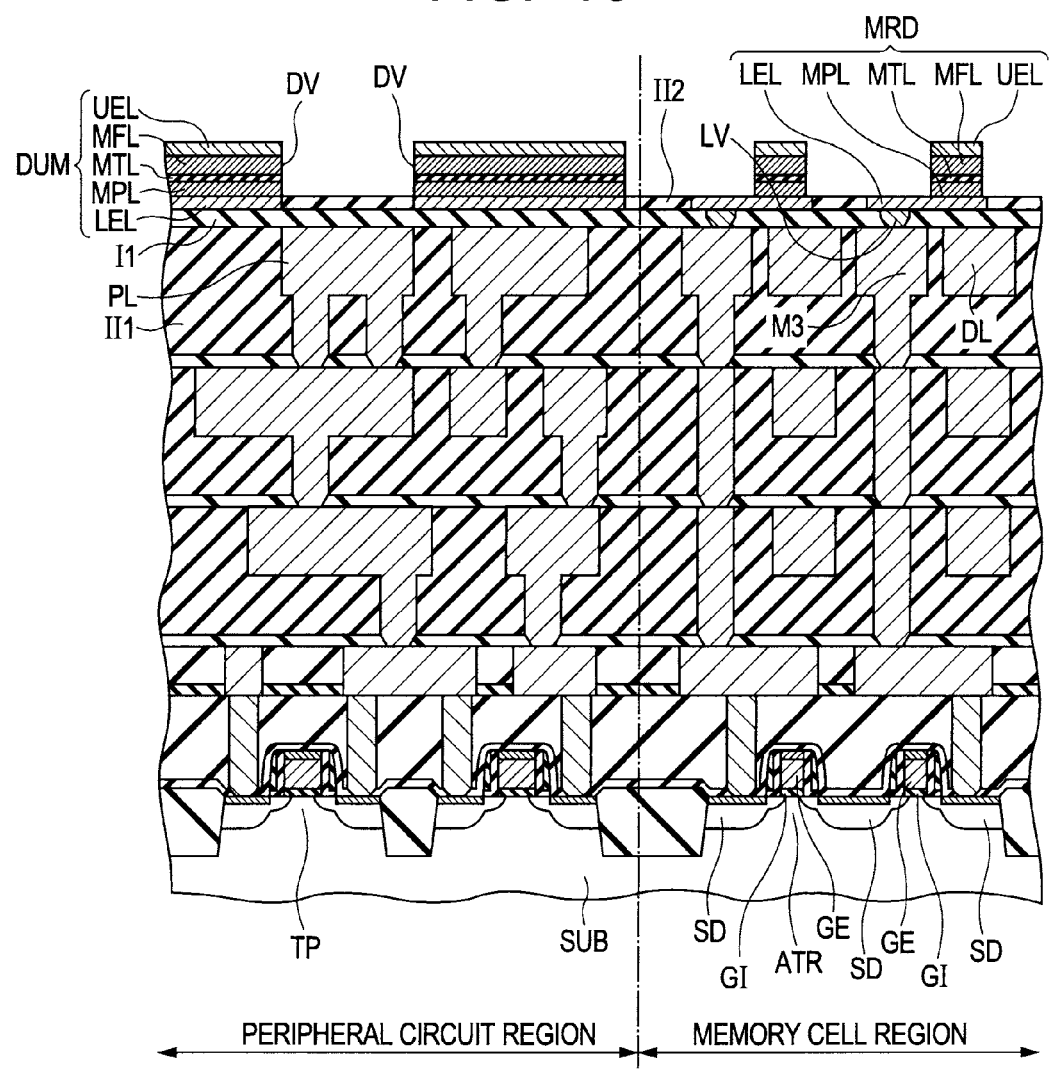
FIG. 18 is a cross-sectional view showing a step performed after the step shown in FIG. 17 in the first embodiment of the present invention.

Referring to FIG. 18, as with the step shown in FIG. 12, first, the prescribed film to be the upper electrode UEL is etched into a prescribed shape. Then, as with the step shown in FIG. 12, with the upper electrode (upper electrode equivalent layer) UEL as a mask, the prescribed film to be the free layer MFL, the prescribed film to be the tunneling insulation layer MTL, and the prescribed film to be the pinned layer MPL are etched under prescribed conditions. By the etching, in the memory cell region, there are formed the pinned layer MPL, the tunneling insulation layer MTL, the free layer MFL, and the upper electrode UEL. Whereas, in the peripheral circuit region, there are formed the pinned equivalent layer MPL, the tunneling equivalent layer MTL, the free equivalent layer MFL, and the upper electrode equivalent layer UEL. Thus, as with FIG. 13, there are formed the magnetoresistive elements MRD and the dummy multilayer structures DMM, and the dummy via DV.

Further, as with the step shown in FIG. 12, a protective layer covering the sidewall of the magnetoresistive element MRD is formed. Incidentally, respective steps from this point forward (FIGS. 19 to 22) are common to both of the first or second processing method. In FIGS. 19 to 22, the part under the wires M3, PL, and DL (the semiconductor substrate SUB side) is not shown.

Figure 19:
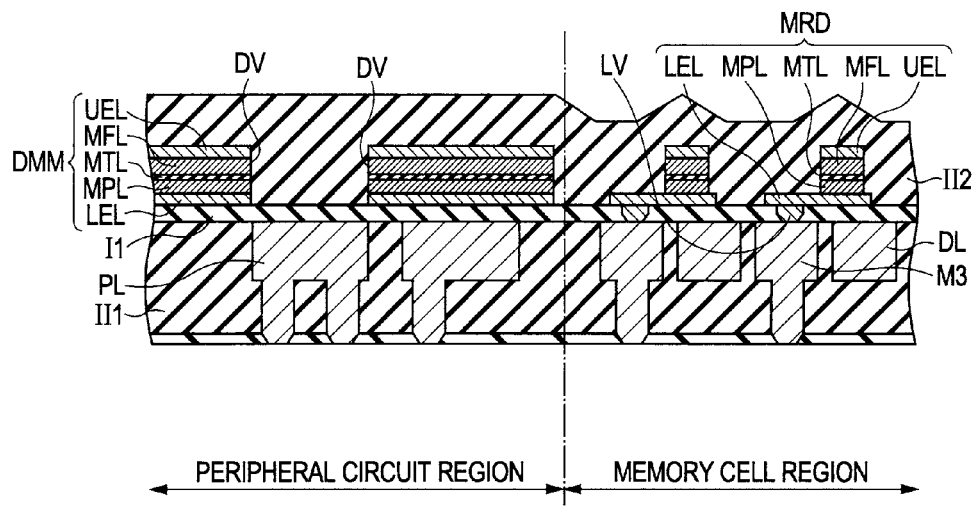
FIG. 19 is a cross-sectional view showing a step performed after the step shown in FIG. 13 or 18 in the first embodiment of the present invention.

Referring to FIG. 19, in such a manner as to cover the magnetoresistive elements MRD (dummy multilayer structures DMM) shown in FIG. 13 or 18, the silicon oxide film II2 to be interlayer insulation layer is formed. The silicon oxide film II2 is made of the same material as that for the silicon oxide film II2 interposed between the lower electrodes LEL shown in FIG. 18. Namely, when the second processing method is used, the silicon oxide film II2 interposed between the lower electrodes LEL, and the silicon oxide film II2 formed in FIG. 19 are integrated.

Figure 20:
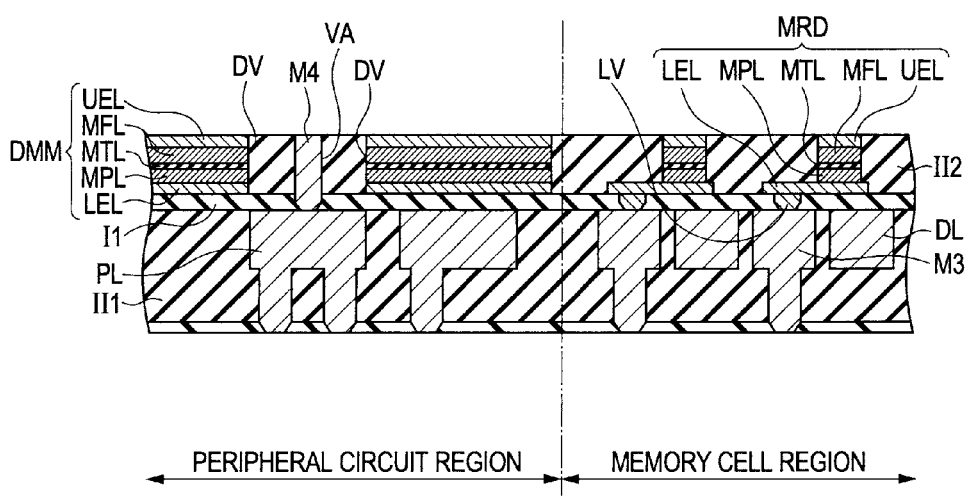
FIG. 20 is a cross-sectional view showing a step performed after the step shown in FIG. 19 in the first embodiment of the present invention.

Referring to FIG. 20, the silicon oxide film II2 is subjected to a chemical mechanical polishing processing. As a result, the silicon oxide film II2 is polished and removed until the top surface of the upper electrode (upper electrode equivalent layer) UEL is exposed. By this processing, the top surface of the silicon oxide film II2 in the memory cell region and the peripheral circuit region is planarized so that the thickness (with respect to the direction of lamination) thereof becomes roughly constant in either region. The term "roughly constant thickness of the silicon oxide film II2" herein referred to is roughly equal to the thicknesses of the magnetoresistive element MRD and the dummy multilayer structure DMM, i.e., the sum of the thicknesses of the lower electrode LEL, the pinned layer MPL, the tunneling insulation layer MTL, the free layer MFL, and the upper electrode UEL.

Herein, particularly, it is more preferable that the silicon oxide film II2 in the memory cell region is polished and removed in such a degree that the upper electrode UEL of the magnetoresistive element MRD and the like are not ground.

Then, in the peripheral circuit region, in the dummy via DV interposed between the dummy multilayer structures DMM, by a general photomechanical process technology and etching, a dummy via hole VA is formed as a hole passing through the insulation film I1 and the interlayer insulation layer II2, and exposing at least a part of the peripheral wire PL. The resist pattern (not shown) used for the photomechanical process technology is removed by, for example, asking. Then, a barrier metal (not shown) is formed over the silicon oxide film II2 and the dummy multilayer structures DMM in such a manner as to cover the bottom surface and the sidewall of the dummy via hole VA. A tungsten film is formed thereover.

The tungsten film and the barrier metal are subjected to a chemical mechanical polishing processing. As a result, the tungsten film and the barrier metal are polished and removed until the top surface of the silicon nitride film I1 is exposed. Then, in the dummy via hole VA, the barrier metal and the tungsten film are left, resulting in the formation of a wire M4 including the barrier metal and the tungsten film. Further, the top surfaces of the wire M4, the interlayer insulation layer II2, the upper electrode UEL, and the like are planarized by the chemical mechanical polishing processing.

Figure 21:
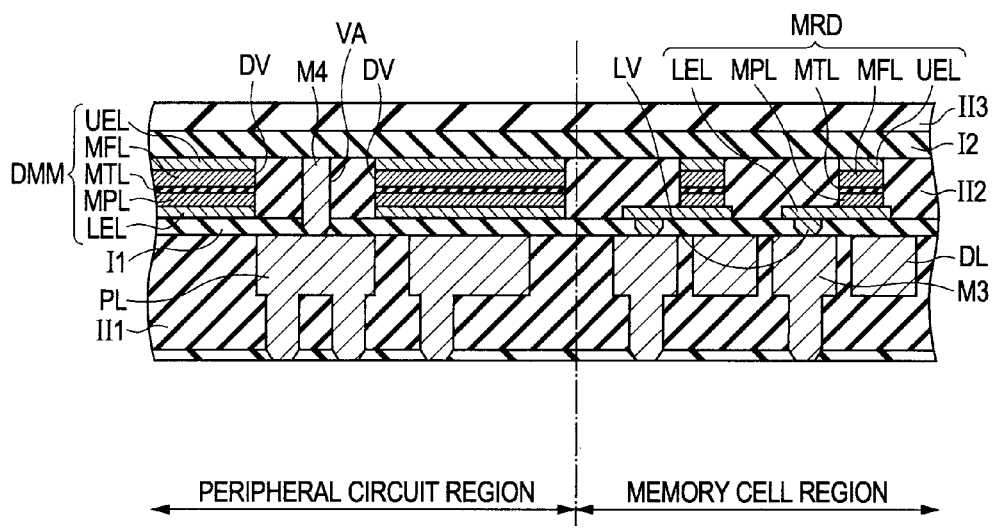
FIG. 21 is a cross-sectional view showing a step performed after the step shown in FIG. 20 in the first embodiment of the present invention.

Referring to FIG. 21, over the magnetoresistive elements MRD, the dummy multilayer structures DMM, and the interlayer insulation layer II2, a silicon nitride film I2 and a silicon oxide film II3 are stacked in this order. These are formed in the same manner as the silicon nitride film I1 and the silicon oxide films II1 and II2 other than these. The silicon nitride film I2 and the silicon oxide film II3 are films disposed at the same layer as the bit line BL2 shown in FIGS. 5 and 6. Therefore, although not shown in FIG. 21, there are removed the silicon nitride film I2 and the silicon oxide film II3 in the region in which the bit lines BL2 are disposed as shown in FIGS. 5 and 6.

Specifically, by a general photomechanical process technology and etching, there is formed a via hole passing through the silicon nitride film I2 and the silicon oxide film II3, and exposing at least a part of the upper electrode (upper electrode equivalent layer) UEL and the interlayer coupling wire M4. The resist pattern (not shown) used for the photomechanical process technology is removed by, for example, asking.

Figure 22:
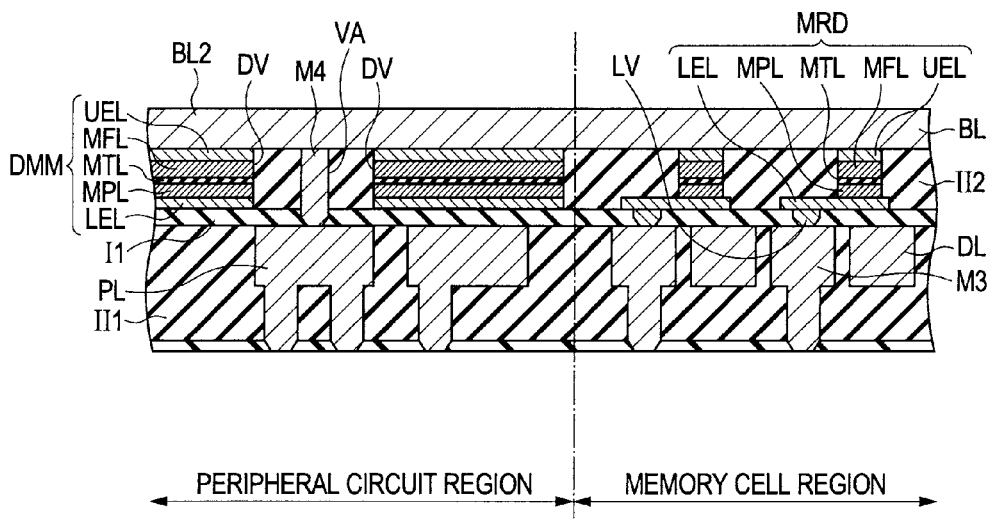
FIG. 22 is a cross-sectional view showing a step performed after the step shown in FIG. 21 in the first embodiment of the present invention.

Referring to FIG. 22, a cladding layer (not shown) is formed at the uppermost surface in such a manner as to cover the bottom and the sidewall of the via hole. A copper film is formed thereover. The copper film and the cladding layer are subjected to a chemical mechanical polishing processing, resulting in the formation of bit lines BL (BL2) including copper, and including a cladding layer. Then, the silicon nitride film I3, and the silicon oxide film II4, and particularly, in the peripheral circuit region, electrode pads to be electrically coupled with external loads, and the like are formed. This results in the formation of the semiconductor device of the plan view of FIG. 3, and the cross-sectional view of FIG. 4.

Then, referring to FIGS. 23 to 32 showing comparative examples of the present embodiment, the advantageous effects of the present embodiment will be described. First, referring to a first comparative example of FIGS. 23 to 27, a first problem of the comparative example and the advantageous effects of the present embodiment will be described.

Figure 23:
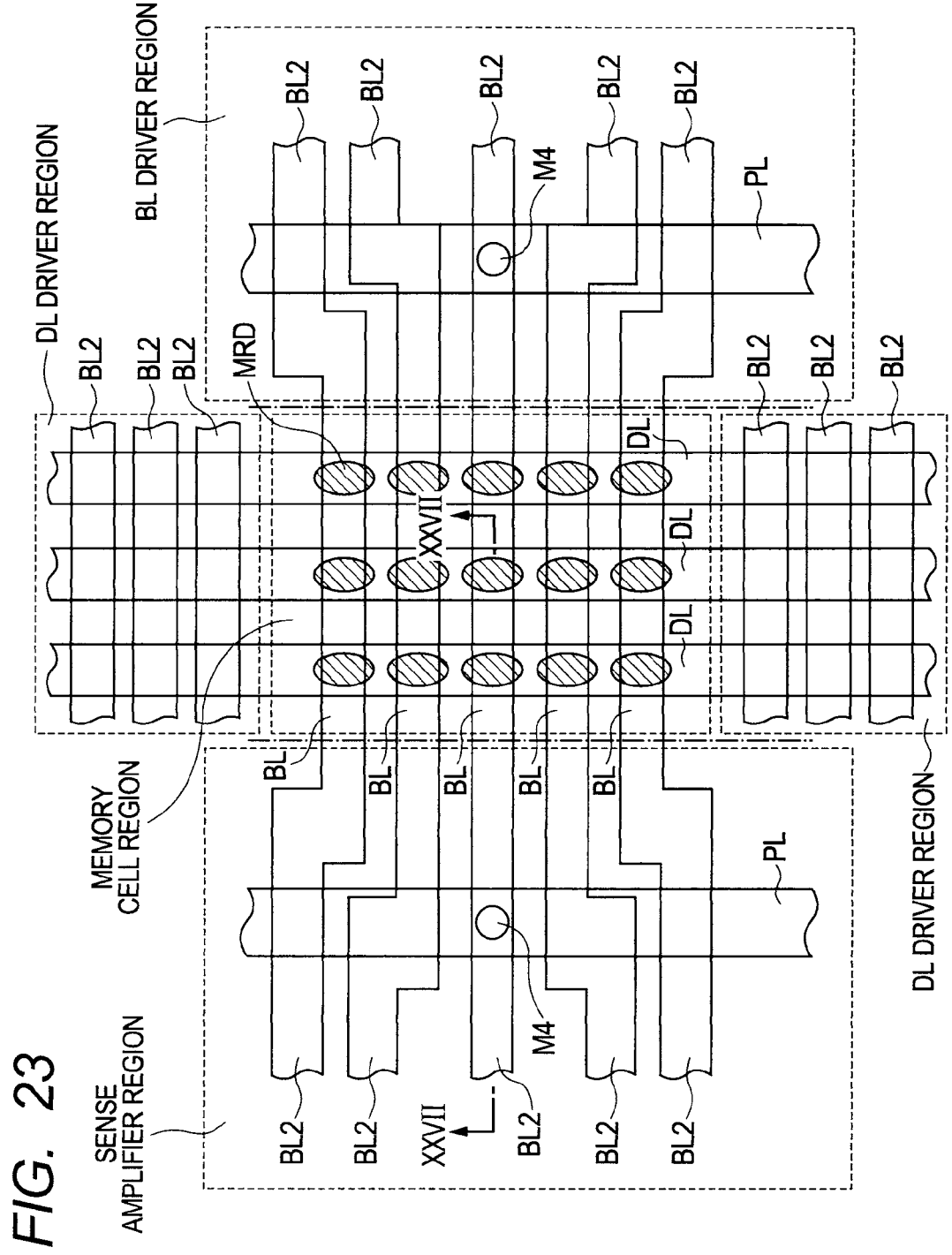
FIG. 23 is a plan view showing a layout in plan view of the magnetoresistive elements, the bit lines, the digit lines, and the like disposed in the same memory cell region and peripheral circuit region as those of FIG. 3 in a first comparative example of the first embodiment of the present invention.

Referring to FIG. 23, also in the semiconductor device of the first comparative example of the present embodiment, in both the memory cell region and the peripheral circuit region, the magnetoresistive element MRD, and various wires such as the bit line BL (BL2) and the digit line DL have roughly the same configurations as those in the present embodiment shown in FIG. 3. However, in the first comparative example, in the peripheral circuit region, the dummy multilayer structures DMM are not disposed. In this respect, the first comparative example is different from the present embodiment.

Then, the method for manufacturing the MRAM shown in FIG. 23 will be described by reference to FIGS. 24 to 27. Incidentally, in FIGS. 24 to 27, as with FIGS. 19 to 22, in the memory cell region and the sense amplifier region, the same cross section as the cross section shown in FIG. 4 (only the wire M3 and the overlying layers) are shown.

Figure 24:
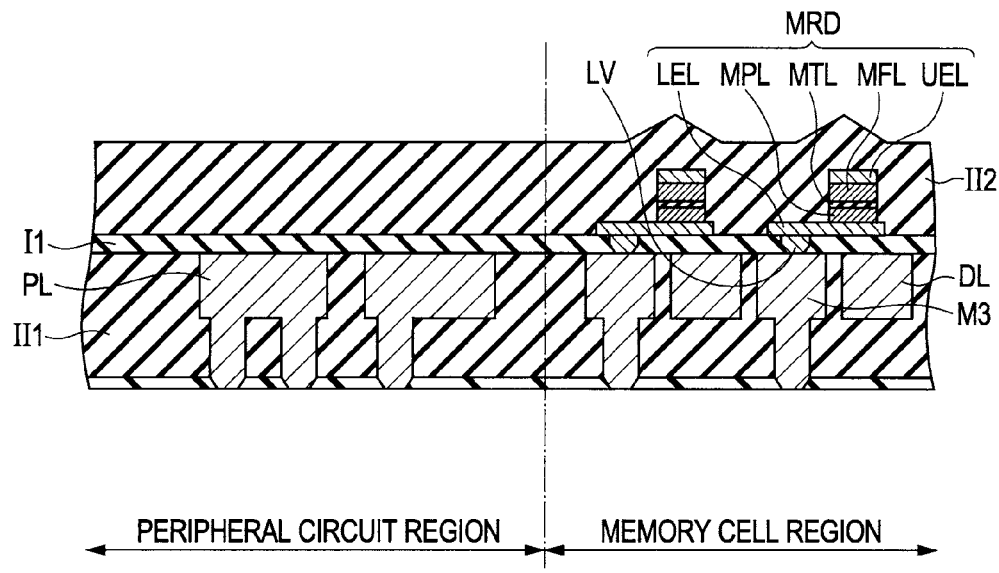
FIG. 24 is a cross-sectional view showing a step corresponding to FIG. 19 of the method for manufacturing the memory cell region and the peripheral circuit region shown in FIG. 23.

Referring to FIG. 24, in the memory cell region, the magnetoresistive elements MRD are formed, and in the peripheral circuit region, the dummy multilayer structure is not formed. In this configuration, as with the step shown in FIG. 19, a silicon oxide film II2 to be an interlayer insulation layer is formed in such a manner as to cover the magnetoresistive elements MRD.

Figure 25:
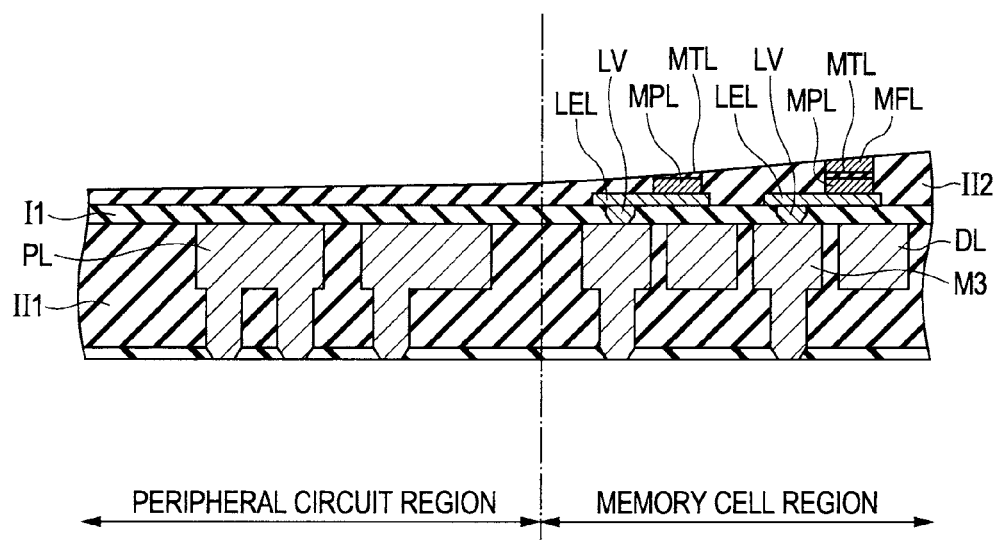
FIG. 25 is a cross-sectional view showing a step performed after the step shown in FIG. 24 in the first comparative example of the first embodiment of the present invention.

Referring to FIG. 25, as with the step shown in FIG. 20, the silicon oxide film II2 is subjected to a chemical mechanical polishing processing. As a result, the silicon oxide film II2 is polished and removed until the top surface of the upper electrode (upper electrode equivalent layer) UEL is exposed.

However, when a dummy multilayer structure of lamination of respective thin films equal in material and thickness to respective thin films forming the magnetoresistive element MRD is not formed in the peripheral circuit region, so-called dishing occurs during the polishing processing (CMP). Namely, of a plurality of magnetoresistive elements MRD arranged in the memory cell region, for example, a part (the upper electrode UEL, the free layer MFL, and the like) of the multilayer structure of the magnetoresistive element MRD disposed in a region closer to the peripheral circuit region is ground together with the silicon oxide film II2. This is for the following reason. With CMP, the silicon oxide film II2 is easier to grind than the magnetic layer forming the free layer MFL or the like, and the thin film of a conductor forming the upper electrode UEL and the like of the magnetoresistive element MRD. The material to be ground differs between in the memory cell region and in the peripheral circuit region. For this reason, it becomes difficult to keep the balance in grinding ratio by CMP between the memory cell region and the peripheral circuit region. As a result, the phenomenon shown in FIG. 25 occurs.

Figure 26:
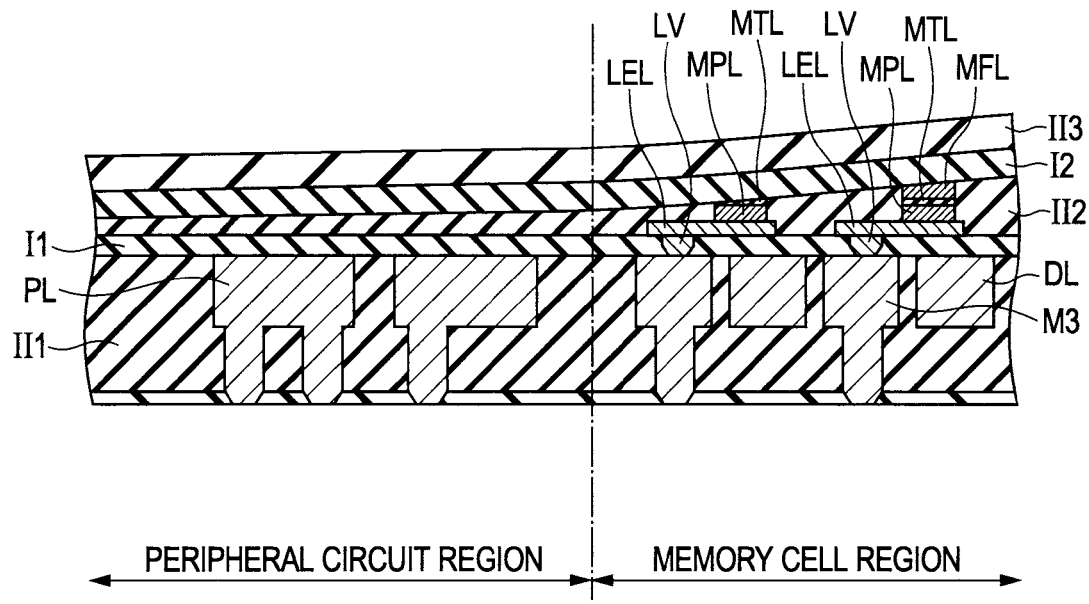
FIG. 26 is a cross-sectional view showing a step performed after the step shown in FIG. 25 in the first comparative example of the first embodiment of the present invention.
Figure 27:
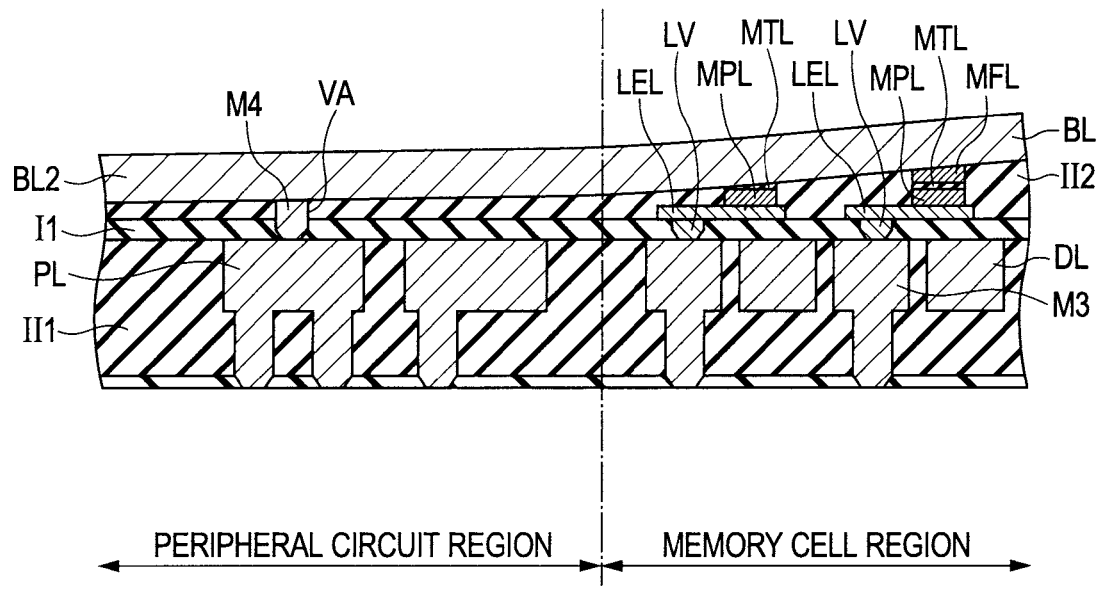
FIG. 27 is a cross-sectional view showing a step performed after the step shown in FIG. 26 in the first comparative example of the first embodiment of the present invention.

Respective steps shown in FIGS. 26 and 27 correspond to respective steps shown in FIGS. 21 and 22 of the present embodiment, respectively. FIG. 27 corresponds to the schematic cross-sectional view along line XXVII-XXVII in a finished product of a semiconductor device of the comparative example of FIG. 23.

Incidentally, the interlayer coupling wire M4 in the peripheral circuit region is formed in the same manner as with the step of forming the dummy via hole VA, and the like shown in FIG. 20 at a position overlapping the peripheral wire PL in plan view. As shown in FIG. 25, the uppermost surface of the silicon oxide film II2 is inclined, and has a thickness varying between regions. In this case, the bit line BL formed thereover is also inclined following the uppermost surface of the silicon oxide film II2. Then, as shown in FIG. 27, the bit line BL and the pinned layer MPL may be short-circuited. The short-circuit makes impossible rewriting and reading of data to and from the memory cells including the MRAMs.

In order to suppress the occurrence of the foregoing defective conditions, as in the present embodiment, the multilayer structure DMM equal in materials, and preferably equal in thicknesses to the multilayer structure shown by the magnetoresistive element MRD is formed in the peripheral circuit region. With this configuration, the ratio of amounts of the silicon oxide film II2 to be polished by CMP between the memory cell region and the peripheral circuit region becomes roughly constant. For this reason, it is possible to make roughly constant the thickness of the silicon oxide film II2 after polishing in the memory cell region and in the peripheral circuit region. In other words, the top surface of the silicon oxide film II2 after polishing can be made more flat (so as not to be inclined). Therefore, in the configuration in which the bit line BL and (the upper electrode UEL of) the magnetoresistive element MRD in the memory cell region are coupled so as to be in direct contact with each other as in the present embodiment, it is possible to suppress a short circuit between the bit line BL and the pinned layer MPL.

However, when the dummy multilayer structures are formed randomly at given positions in the peripheral circuit region, the following defective conditions may occur. Then, referring to the second comparative example of FIGS. 28 to 32, a description will be given to the second problems of the comparative example, and the advantageous effects of the present embodiment.

Figure 28:
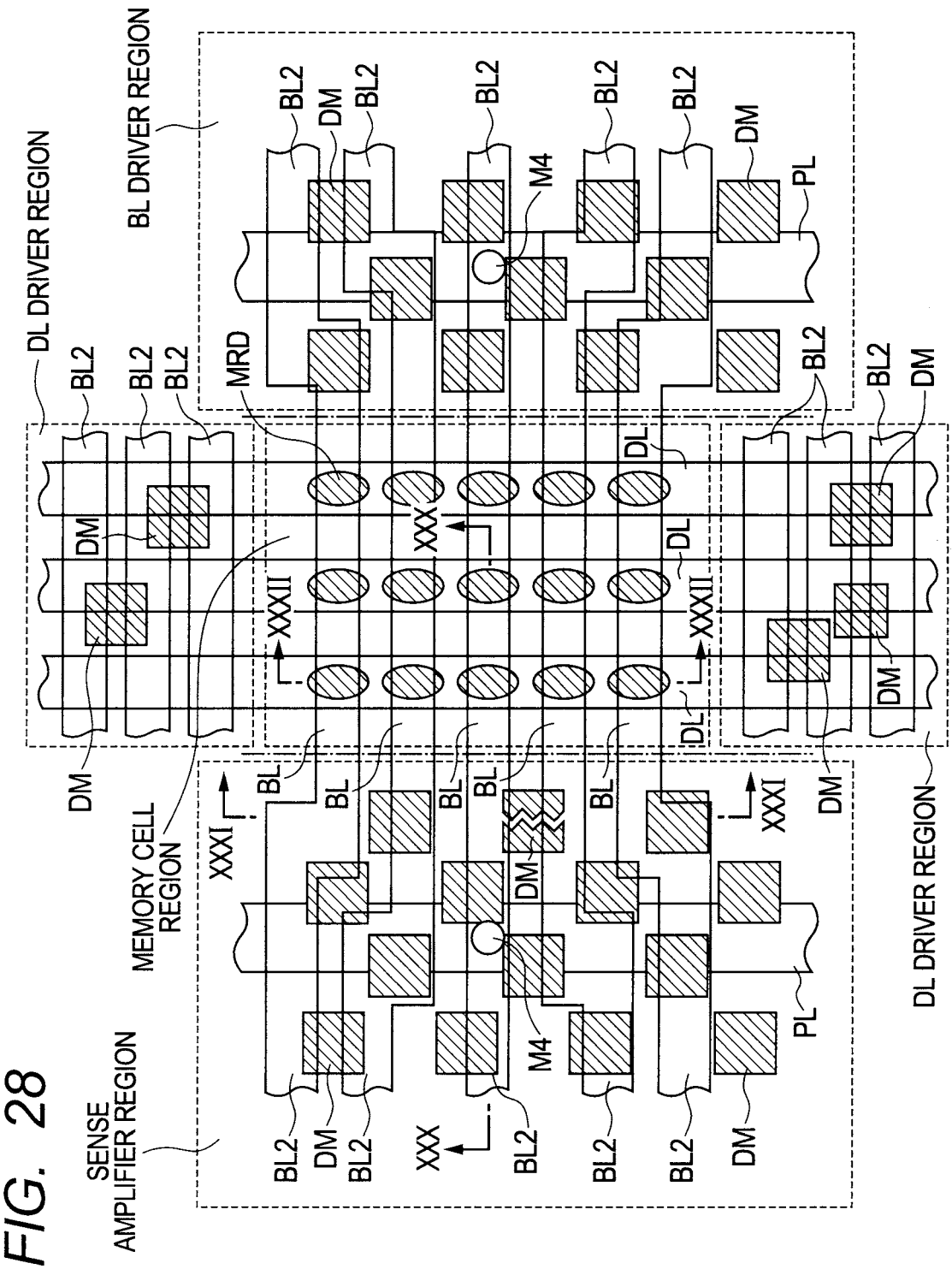
FIG. 28 is a plan view showing a layout in plan view of the magnetoresistive elements, the bit lines, the digit lines, and the like disposed in the same memory cell region and peripheral circuit region as those of FIG. 3 in a second comparative example of the first embodiment of the present invention.

Referring to FIG. 28, also in the second comparative example of the present embodiment, both in the memory cell region and the peripheral circuit region, the magnetoresistive elements MRD, and various wires such as bit lines BL (BL2) and digit lines DL have roughly the same configurations as those of the present embodiment shown in FIG. 3. However, in the second comparative example, each comparative dummy DM formed in the peripheral circuit region is not disposed in such a manner as to be along a region overlapping the bit line BL2 in plan view. The comparative dummy DM is assumed to be a multilayer structure equal in configuration and thickness to the dummy multilayer structure DMM.

For example, as shown in a portion along line XXX-XXX of FIG. 28, one comparative dummy DM is formed in such a manner as to overlap the interlayer coupling wire M4 in plan view. Further, for example, as shown in a portion along line XXXI-XXXI of FIG. 28, another comparative dummy DM is disposed in such a manner as to overlap both of a pair of adjacent bit lines BL2 (extend over both), and to be electrically coupled with both. In this respect, the second comparative example is different from the present embodiment.

Then, a method for manufacturing the MRAM shown in FIG. 28 will be described by reference to FIGS. 29 and 30. Incidentally, FIGS. 29 and 30, as with FIGS. 19 to 22, each show the same cross section (only the wire M3 and the overlying layers) as the cross section shown in FIG. 4 of the memory cell region and the peripheral circuit region of the sense amplifier.

Figure 29:
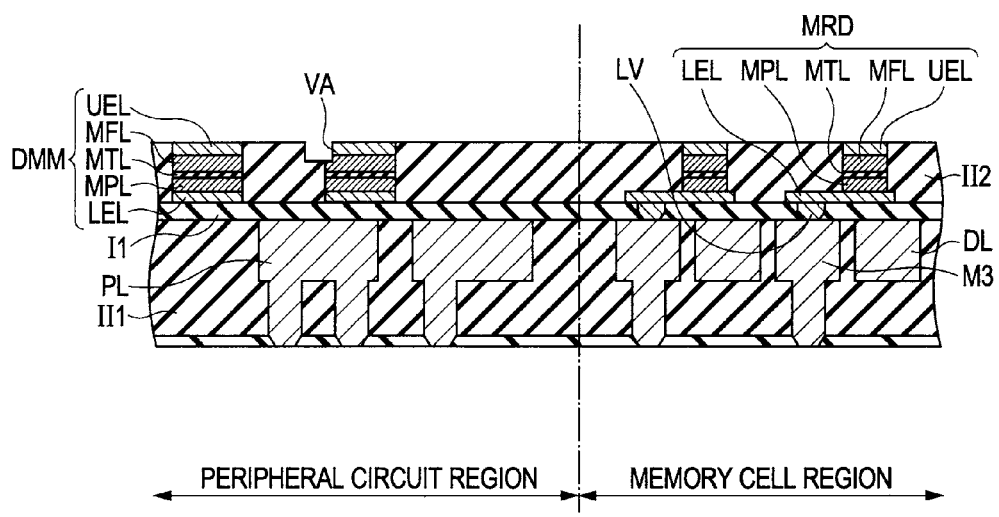
FIG. 29 is a cross-sectional view showing a step corresponding to FIG. 20 of the method for manufacturing the memory cell region and the peripheral circuit region shown in FIG. 28.
Figure 30:
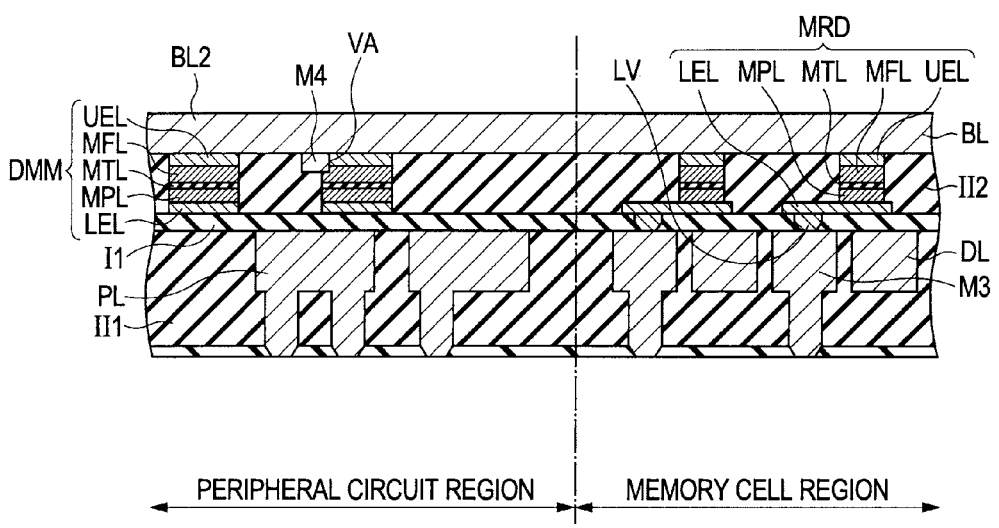
FIG. 30 is a cross-sectional view showing a step performed after the step shown in FIG. 29 in the second comparative example of the first embodiment of the present invention.

Referring to FIG. 29, in the memory cell region, the magnetoresistive elements MRD are formed, and in the peripheral circuit region, the dummy multilayer structure is not formed. In this configuration, as with the step shown in FIG. 19, the silicon oxide film II2 to be an interlayer insulation layer is formed in such a manner as to cover the magnetoresistive elements MRD. Then, as with the step shown in FIG. 20, the silicon oxide film II2 is subjected to a chemical mechanical polishing processing. As a result, the silicon oxide film II2 is polished and removed until the top surface of the upper electrode (upper electrode equivalent layer) UEL is exposed.

Then, in the peripheral circuit region, a dummy via hole VA is formed. The inside thereof is filled with a metal material, resulting in the formation of the same interlayer coupling wire M4 as that of FIG. 20. Subsequently, the same processings as those of FIGS. 21 and 22 are performed. This results in the form of the cross section along line XXX-XXX of FIG. 28, shown in FIG. 30.

However, herein, the comparative dummies DM are formed at random positions in plan view. Therefore, when the dummy via hole VA is formed, etching is inhibited by the comparative dummies DM. As a result, the dummy via hole VA may be inhibited from being formed in a desired opening shape. Alternatively, even when the dummy via hole VA and the wire M4 are formed in respective desired opening shapes, the wire M4 may be short-circuited with the conductor layer of the adjacent comparative dummy DM.

Figure 31:
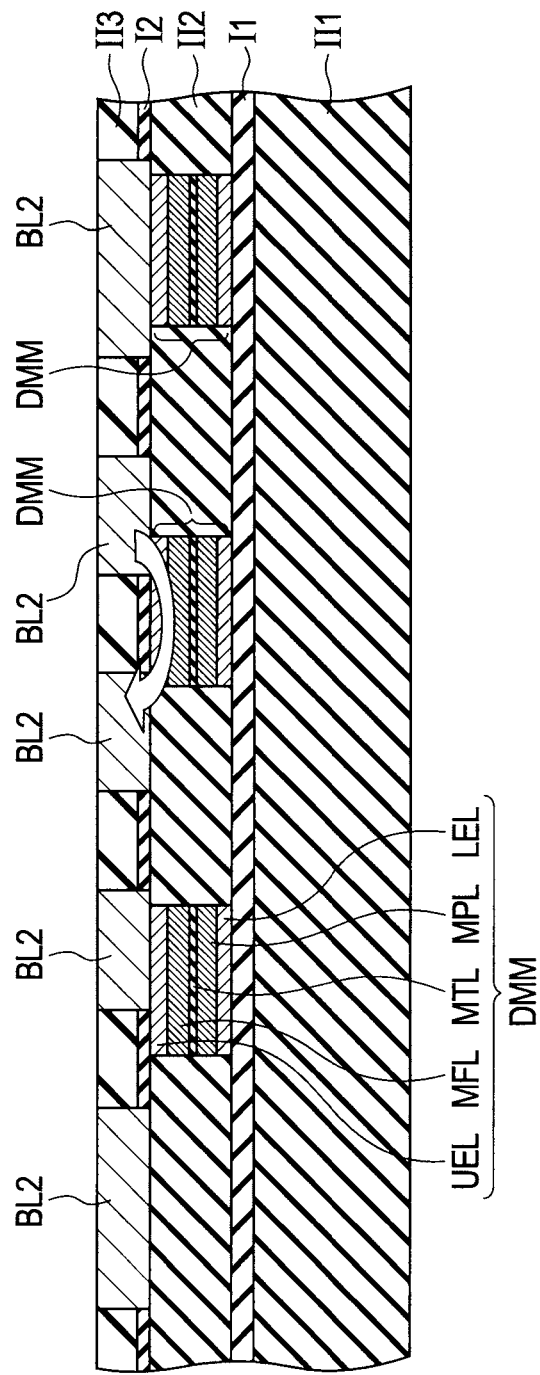
FIG. 31 is a schematic cross-sectional view at a portion along line XXXI-XXXI of FIG. 28.
Figure 32:
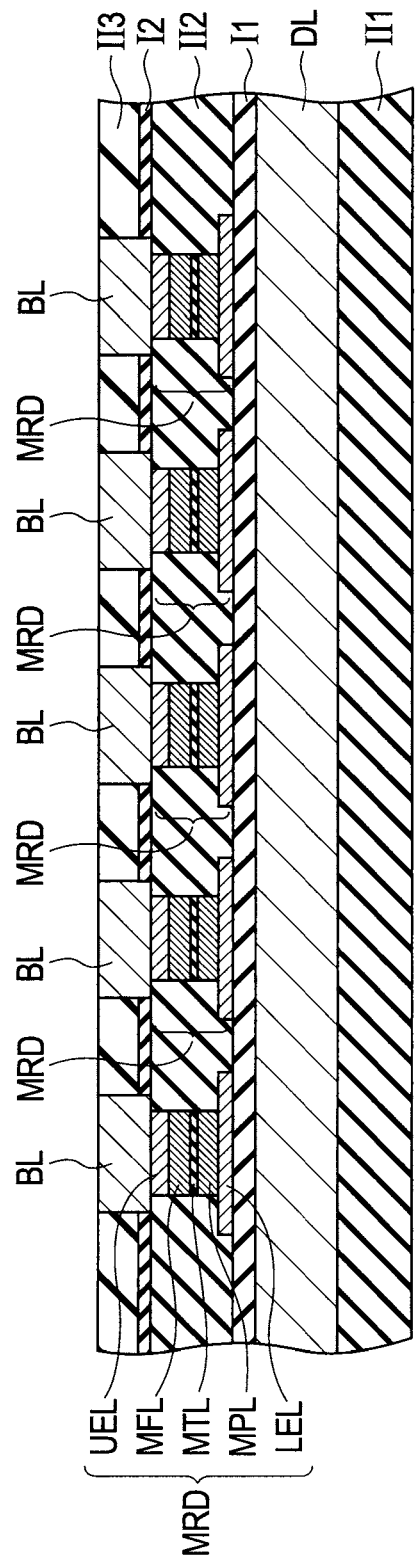
FIG. 32 is a schematic cross-sectional view at a portion along line XXXII-XXXII of FIG. 28.

FIG. 31 shows the relation between the comparative dummies DM and the bit lines BL2. Referring to FIG. 31, the comparative dummy DM formed at a random position is in contact with both of a pair of adjacent bit lines BL2, so that the comparative dummy DM may be electrically coupled with both of the pair of bit lines BL2, respectively. For this reason, as indicated with an arrow in FIG. 31, a current flows between the pair of adjacent bit lines BL2, which may cause a short circuit between the bit lines BL2. FIG. 32 shows the relation between the magnetoresistive elements MRD and the bit lines BL. Referring to FIG. 32, the adjacent bit lines BL are spaced from each other. For this reason, a short circuit is not caused by the conductor layers of the magnetoresistive elements MRD.

In order to inhibit the occurrence of the defective conditions described up to this point, preferably, as with the present embodiment, the dummy multilayer structure DMM is formed in such a manner as to roughly overlap the shape of the bit line BL2 in plan view so as to extend along the direction of extension of the bit line BL2. Preferably, by assuming such a planar shape, the dummy multilayer structure DMM is formed so as not to be in contact with both of a pair of adjacent bit lines BL2. With this configuration, it is possible to solve the problems possessed by the second comparative example. Namely, it is possible to suppress defective conditions such as a short circuit between the adjacent bit lines BL2 caused by the multilayer structure DMM.

Incidentally, the sum of occupancy rates of regions in which the dummy multilayer structures DMM are disposed relative to the whole of the peripheral circuit region in plan view is preferably larger than the sum of occupancy rates of regions in which the magnetoresistive elements MRD are disposed in the whole of the memory cell region. Specifically, the sum of the ratios (occupancy rates) of the areas occupied by all the dummy multilayer structures DMM disposed in the peripheral circuit region relative to the whole area of the peripheral circuit region in plan view is more preferably 1.1 times or more and 1.2 times or less the sum of occupancy rates of all the dummy multilayer structures DMM relative to the whole of the memory cell region in plan view. Incidentally, in each of the BL driver region, the DL driver region, and the sense amplifier region, the ratio (occupancy rate) of the areas occupied by the dummy multilayer structures DMM relative to the whole area in plan view may be 1.1 times or more and 1.2 times or less the sum of the occupancy rates of all the magnetoresistive elements MRD relative to the whole of the memory cell region in plan view.

More specifically, the sum of the ratios (occupancy rates) of the areas occupied by all the dummy multilayer structures DMM disposed in the peripheral circuit region relative to the whole area of the peripheral circuit region in plan view is more preferably 20% or more and 50% or less. Whereas, the sum of the occupancy rates of all the magnetoresistive elements MRD relative to the whole of the memory cell region in plan view is more preferably 16% or more and 45% or less. Incidentally, in each of the BL driver region, the DL driver region, and the sense amplifier region, the sum of the occupancy rates may be 20% or more and 50% or less.

With this configuration, the dummy multilayer structures DMM more enhance the effects of inhibiting the occurrence of dishing during subjecting the interlayer insulation layer II2 to CMP, and making roughly constant the thickness of the interlayer insulation layer II2 after polishing. Further, it is possible to inhibit the occurrence of a defective condition that, during CMP, particularly the interlayer insulation layer II2 in the memory cell region is excessively polished, and that a part of the constituent element of the magnetoresistive element MRD is polished and removed.

Further, the multilayer structure DMM is disposed in such a manner as not to overlap the dummy via hole VA in plan view (so that the multilayer structure DMM is divided in a region in which the dummy via hole VA is formed in plan view). This can inhibit the defective condition that the dummy multilayer structure DMM hinders the dummy via hole VA from being opened. Further, this configuration can also eliminate the possibility that the wire M4 is short-circuited with the conductor layer of the adjacent comparative dummy DM.

Second Embodiment

A second embodiment of the present invention is different in configuration of the dummy multilayer structure from the first embodiment. Below, the configuration of the present embodiment will be described by reference to FIGS. 33 to 34.

Figure 33:
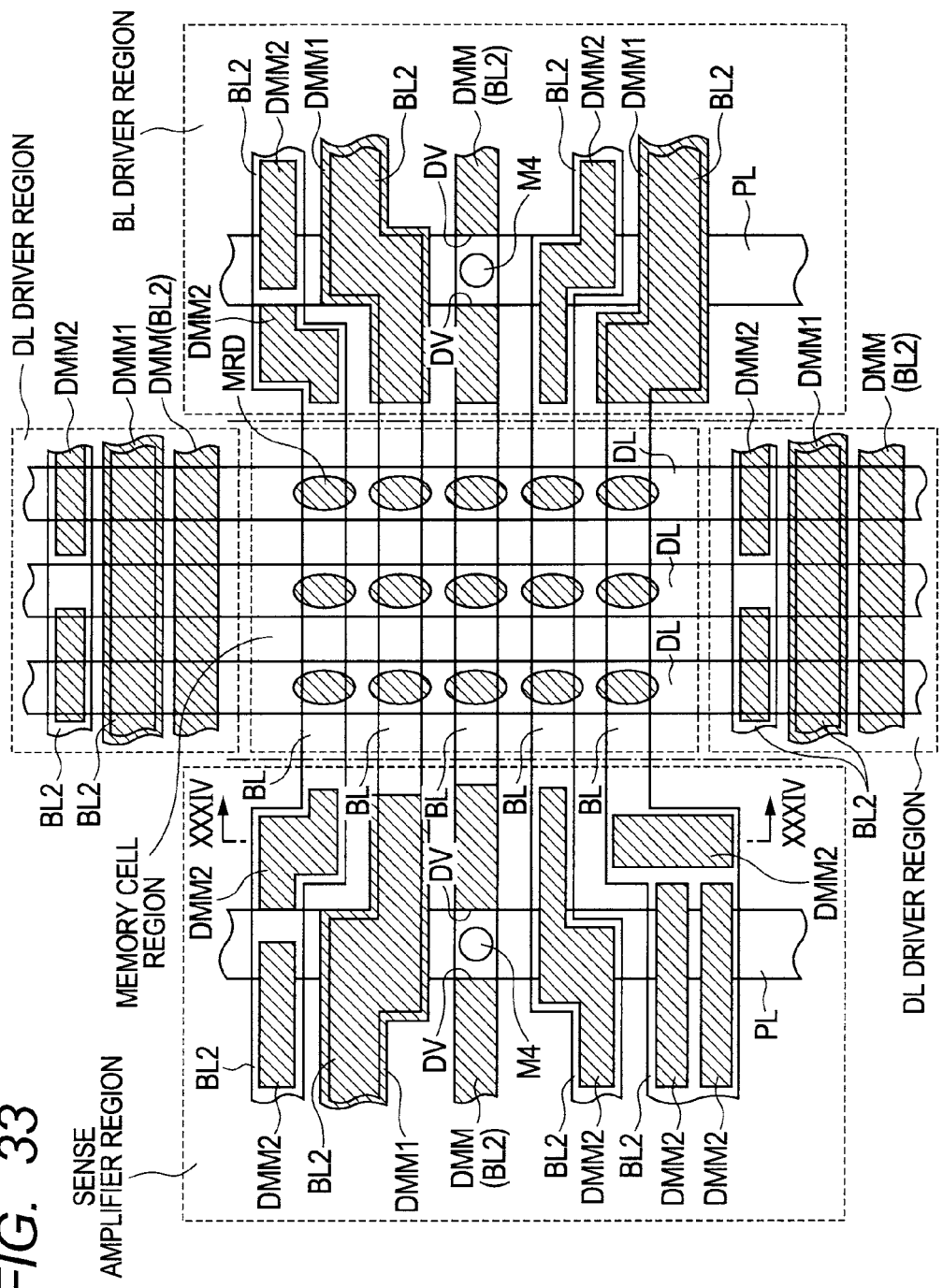
FIG. 33 is a plan view showing a layout in plan view of the magnetoresistive elements, the bit lines, the digit lines, and the like disposed in the same memory cell region and peripheral circuit region as those of FIG. 3 in a second embodiment of the present invention.
Figure 34:
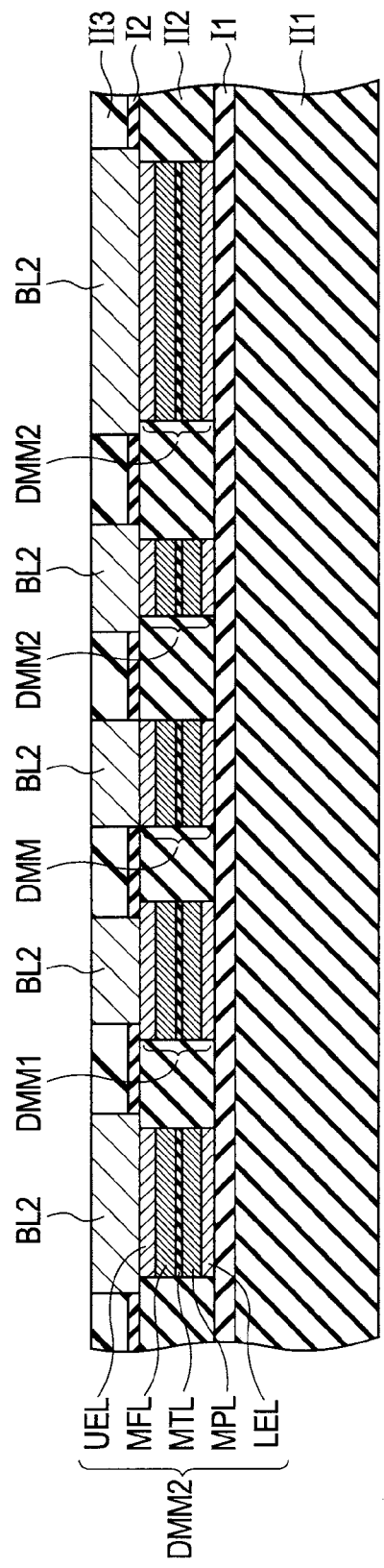
FIG. 34 is a schematic cross-sectional view at a portion along line XXXIV-XXXIV of FIG. 33.

Referring to FIG. 33, also in the semiconductor device of the present embodiment, in both the memory cell region and the peripheral circuit region, the magnetoresistive element MRD, and various wires such as the bit line BL (BL2) and the digit line DL have roughly the same configurations as those of the semiconductor device of the first embodiment shown in FIG. 3. Further, also in the present embodiment, the dummy multilayer structures DMM are basically disposed in such a manner as to overlap the bit lines BL (BL2) in plan view, and not to be short-circuited with a pair of adjacent bit lines BL (BL2).

However, in the present embodiment, the dummy multilayer structure in the peripheral circuit region is also divided into a plurality of small multilayer structures at other than the positions overlapping the interlayer coupling wire M4 in plan. For example, the dummy multilayer structure overlapping the uppermost bit line BL2 in the sense amplifier region in FIG. 33 is divided into two small multilayer structures DMM2 with respect to the direction of extension of the bit line BL2 (the left-to-right direction of the figure). The dummy multilayer structure overlapping the lowermost bit line BL2 in the sense amplifier region of FIG. 33 is divided in both of the direction of extension of the bit line BL2 and the direction crossing therewith (the top-bottom direction of the figure), into a total of three small multilayer structures DMM2.

Not limited to the multilayer structure DMM2 divided as described above, in the present embodiment, some dummy multilayer structures overlap the bit lines BL2 in plan view, but are disposed smaller in size than the bit lines BL2. Specifically, for example, the dummy multilayer structure DMM2 overlapping the bit line BL2 second from the bottom in the sense amplifier region of FIG. 33 is formed in such a manner as to be slightly smaller than the bit line BL2 as a whole.

Whereas, conversely, in the present embodiment, there are also some dummy multilayer structures disposed larger in size than the bit lines BL2 in plan view. For example, the dummy multilayer structure DMM1 overlapping the bit line BL2 second from the top in the sense amplifier region of FIG. 33 is formed so as to be slightly larger than the bit line BL2 as a whole. The dummy multilayer structure of the present embodiment having the foregoing features becomes more obvious by comparison between the cross-sectional view of FIG. 34 and FIG. 5 of the first embodiment.

Incidentally, the dummy multilayer structures DMM1 and DMM2 are each assumed to be a multilayer structure equal in configuration and thickness to the magnetoresistive element MRD and the dummy multilayer structure DMM of the first embodiment.

Incidentally, for example, as described above, preferably, by making the dummy multilayer structure smaller or larger than the bit line BL2 in plan view, the distance between a pair of adjacent dummy multilayer structures DMM in the peripheral circuit region is made roughly constant irrespective of the disposition of the bit lines BL2.

In the foregoing points, the present embodiment is different from the first embodiment, and in other points, is equal to the configuration of the first embodiment. For this reason, the same elements as those of the first embodiment are given the same reference numbers and signs, and a description thereon will not be repeated. Further, also for the semiconductor device of the present embodiment, the basic manufacturing method is the same as that of the first embodiment.

Then, the advantageous effects of the present embodiment will be described. The present embodiment has, in addition to the advantageous effects of the first embodiment, the following effects.

For example, when the width of the bit line BL2 is large, or when the bit line BL2 extends long, the size of the dummy multilayer structure DMM overlapping this in plan view becomes large. Then, a part of the dummy multilayer structure DMM may undergo film peeling. Further, the occupancy rate of the dummy multilayer structures DMM in the peripheral circuit region may become excessively larger than the occupancy rate of the magnetoresistive elements MRD in the memory cell region. When the occupancy rate of the dummy multilayer structures DMM becomes excessively large, during CMP processing of the interlayer insulation layer II2 (see FIG. 20), the magnetoresistive element MRD may be partially polished and removed erroneously. Further, when the occupancy rate of the dummy multilayer structures DMM is excessively small, during CMP processing, for example, as in FIGS. 23 to 27, the same defective conditions such as dishing as in the case where the dummy multilayer structure is not formed may be caused.

Then, as in the present embodiment, some dummy multilayer structures are reduced in size relative to the bit lines BL2, or are each divided into a plurality of small multilayer structures. As a result, it is possible to ensure the occupancy rate of the multilayer structures DMM at a desirable value, and to inhibit the occurrence of the defective conditions such as film peeling.

Further, by enlarging or shrinking the size of the dummy multilayer structure in plan view relative to the bit line BL2, it is possible to make roughly constant the distance between a pair of adjacent dummy multilayer structures DMM in the peripheral circuit region. With this configuration, it is possible to make roughly constant the etching ratio of the dummy multilayer structures DMM patterned in the step of patterning the dummy multilayer structures DMM (see FIGS. 12 and 18) and the periphery of the magnetoresistive elements MRD. Therefore, it is possible to suppress the occurrence of the defective conditions such as a short circuit due to contact between a pair of the formed adjacent magnetoresistive elements MRD, and a pair of the formed adjacent dummy multilayer structures DMM.

From the description up to this point, for example, when the distance between the bit lines BL2 in plan view is very short, the dummy multilayer structures are made smaller, which can suppress a short circuit between the dummy multilayer structures. When dummy multilayer structures each equal in area to the bit line BL2 are formed, the occupancy rate of the dummy multilayer structures becomes excessively large. In this case, by more reducing the size of the dummy multilayer structures, it is possible to adjust the occupancy rate to a proper value.

Further, for example, when the distance between the bit lines BL2 in plan view is very long, the dummy multilayer structures are made larger. As a result, it is possible to make all the distances between the dummy multilayer structures roughly constant values. When dummy multilayer structures each equal in area to the bit line BL2 are formed, the occupancy rate of the dummy multilayer structures becomes excessively small. In this case, by making the dummy multilayer structures larger, it is possible to adjust the occupancy rate to a proper value.

The second embodiment of the present invention is different in only respective points described above from the first embodiment of the present invention. Namely, for the second embodiment of the present invention, the configurations, conditions, procedures, effects, and the like, not described above all follow the first embodiment of the present invention.

Third Embodiment

A third embodiment of the present invention is different in configuration of the dummy multilayer structure from the first embodiment and the second embodiment. Below, the configuration of the present embodiment will be described by reference to FIG. 35.

Figure 35:
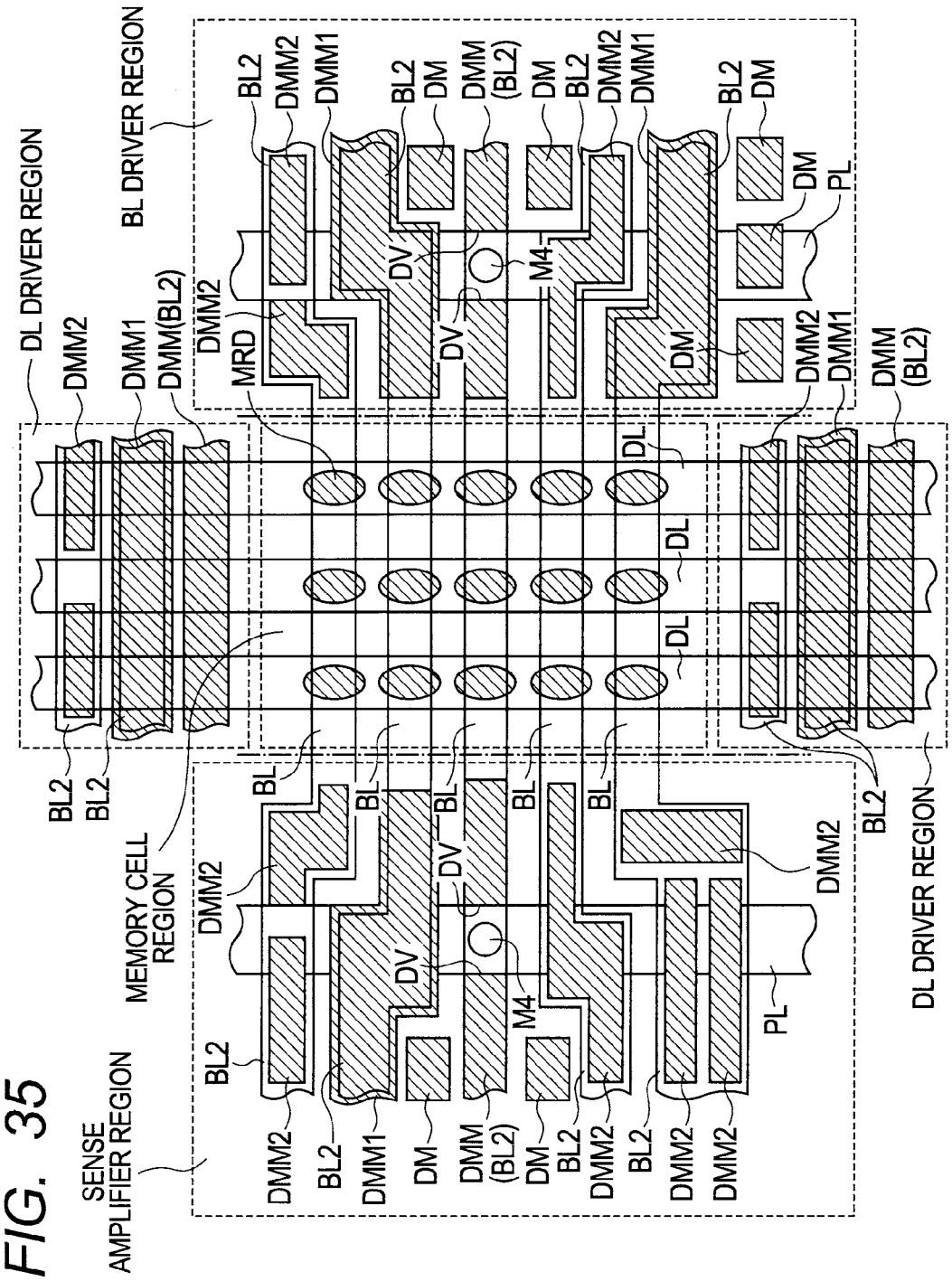
FIG. 35 is a plan view showing a layout in plan view of the magnetoresistive elements, the bit lines, the digit lines, and the like disposed in the same memory cell region and peripheral circuit region as those of FIG. 3 in a third embodiment of the present invention.

Referring to FIG. 35, also in the semiconductor device of the present embodiment, in both the memory cell region and the peripheral circuit region, the magnetoresistive element MRD, and various wires such as the bit line BL (BL2) and the digit line DL have roughly the same configurations as those in the first embodiment shown in FIG. 3. Further, the dummy multilayer structures DMM1 and DMM2 have the same arrangement as in the semiconductor device of the second embodiment of FIG. 33.

In the present embodiment, in addition to the dummy multilayer structures DMM1 and DMM2 at positions overlapping the bit lines BL2, dummies DM (additional multilayer structures) are also formed at positions at which the bit lines BL2 are not disposed in plan view. The dummies DM herein are assumed to be multilayer structures equal in configuration and thickness to the comparative dummies DM, and the dummy multilayer structures DMM1 and DMM2 shown in FIGS. 23 to 27. Incidentally, each dummy DM is preferably disposed so as not to cause a short-circuit between both of a pair of adjacent bit lines BL2.

In the foregoing points, the present embodiment is different from the first embodiment and the second embodiment, and, in other points, is equal in configuration to the first embodiment and the second embodiment. For this reason, the same elements as those of the first embodiment and the second embodiment are given the same reference numerals and signs, and a description thereon will not be repeated. Also for the semiconductor device of the present embodiment, the basic manufacturing method is the same as that of the first embodiment.

Then, the advantageous effects of the present embodiment will be described. The present embodiment has, in addition to the advantageous effects of the first embodiment and the second embodiment, the following effects.

As in the present embodiment, additional dummies DM are formed at positions not overlapping the bit lines 2. As a result, for example, when the occupancy rate of the dummy multilayer structures in the peripheral circuit region is small, the occupancy rate can be made larger. Therefore, it is possible to suppress the occurrence of dishing, and the like during CMP, due to the insufficient occupancy rate of the dummy multilayer structures in the peripheral circuit region.

The third embodiment of the present invention is different in only respective points described above from the first embodiment and the second embodiment of the present invention. Namely, for the third embodiment of the present invention, configurations and conditions, procedures, effects, and the like not described above all follow those of the first embodiment and the second embodiment of the present invention.

Fourth Embodiment

A fourth embodiment of the present invention is different in configuration of dummy multilayer structure from the first embodiment. Below, the configuration of the present embodiment will be described by reference to FIGS. 36 to 38.

Figure 36:
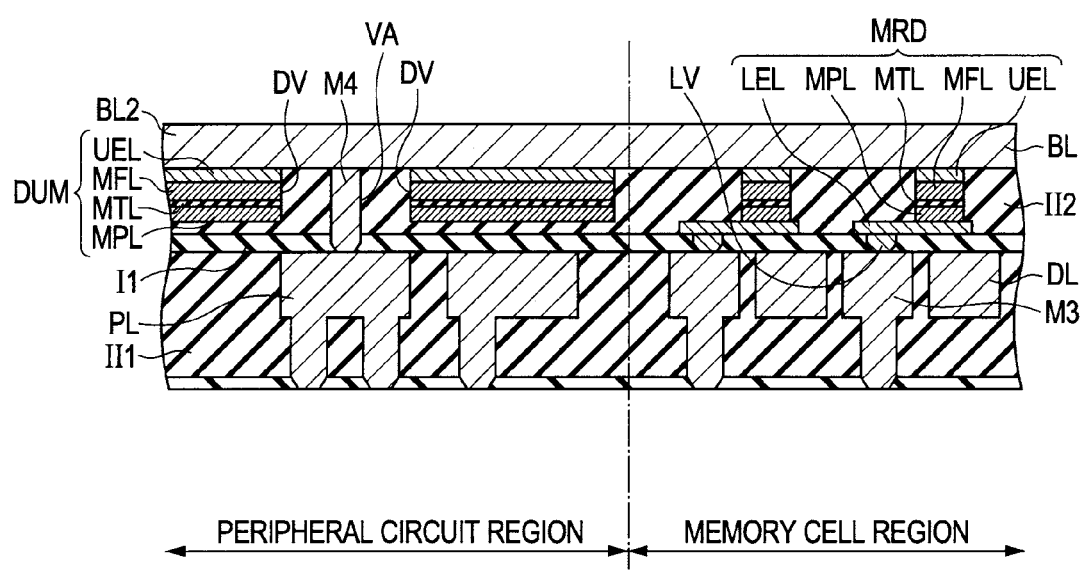
FIG. 36 is a cross-sectional view showing a memory cell region and a peripheral circuit region in a MRAM in the same direction as that of FIG. 4 in a fourth embodiment of the present invention.

Referring to FIG. 36, in the present embodiment, the dummy multilayer structure DMM in the peripheral circuit region does not include a lower electrode equivalent layer LEL. Incidentally, in FIG. 36, as with, for example, FIGS. 19 to 22, respective layers closer to the semiconductor substrate SUB than the wires M3 and PL are not shown.

As distinct from the magnetoresistive element MRD, the dummy multilayer structure DMM itself is not used as an element, and hence may lack a film corresponding to the lower electrode. At the same layer as the lower electrode LEL of the magnetoresistive element MRD, there may be disposed a silicon oxide film II2 having the same thickness as that of the lower electrode LEL. Also in this case, when the pinned equivalent layer MPL, the free equivalent layer MFL, and the like having the same configuration as that of the magnetoresistive element MRD are stacked at a part overlying the silicon oxide film II2 having the same thickness as that of the lower electrode LEL, the resulting lamination has sufficient functions as the dummy multilayer structure DMM.

Figure 37:
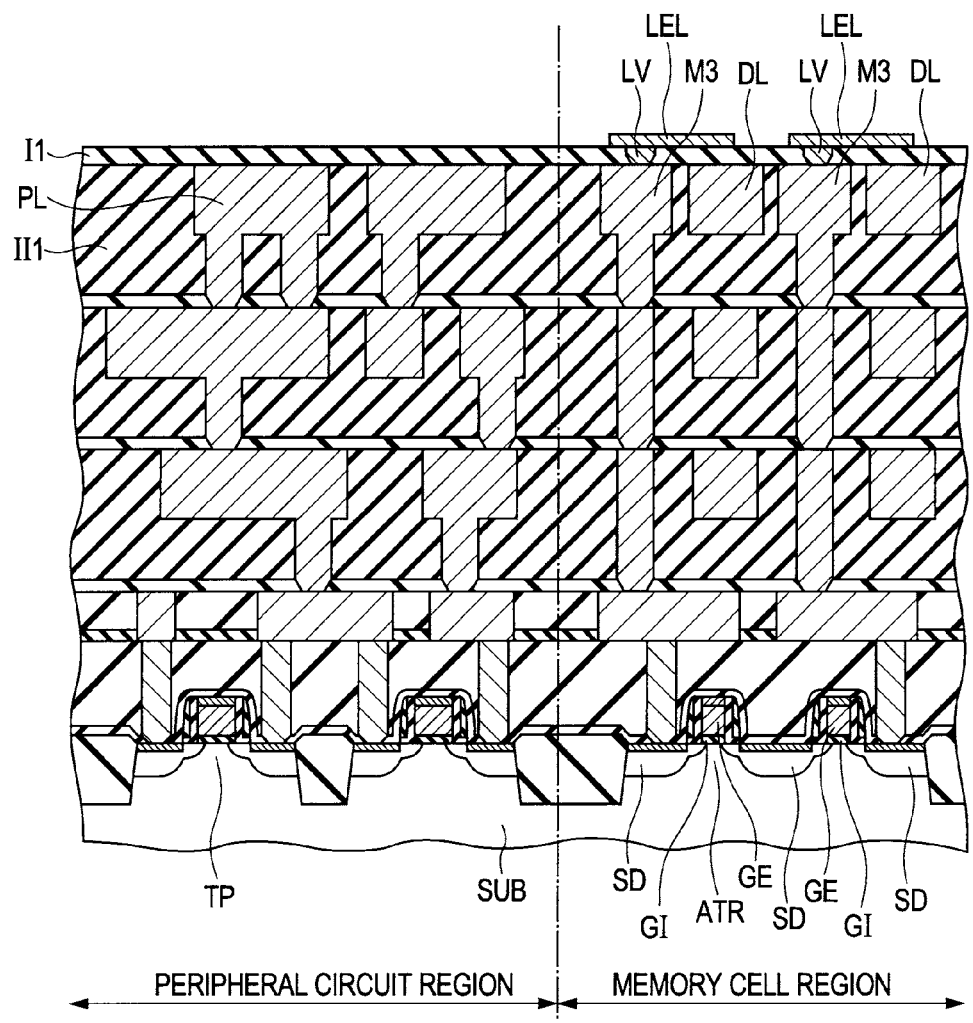
FIG. 37 is a cross-sectional view showing a step corresponding to FIG. 14 of the method for manufacturing the memory cell region and the peripheral circuit region shown in FIG. 36.
Figure 38:
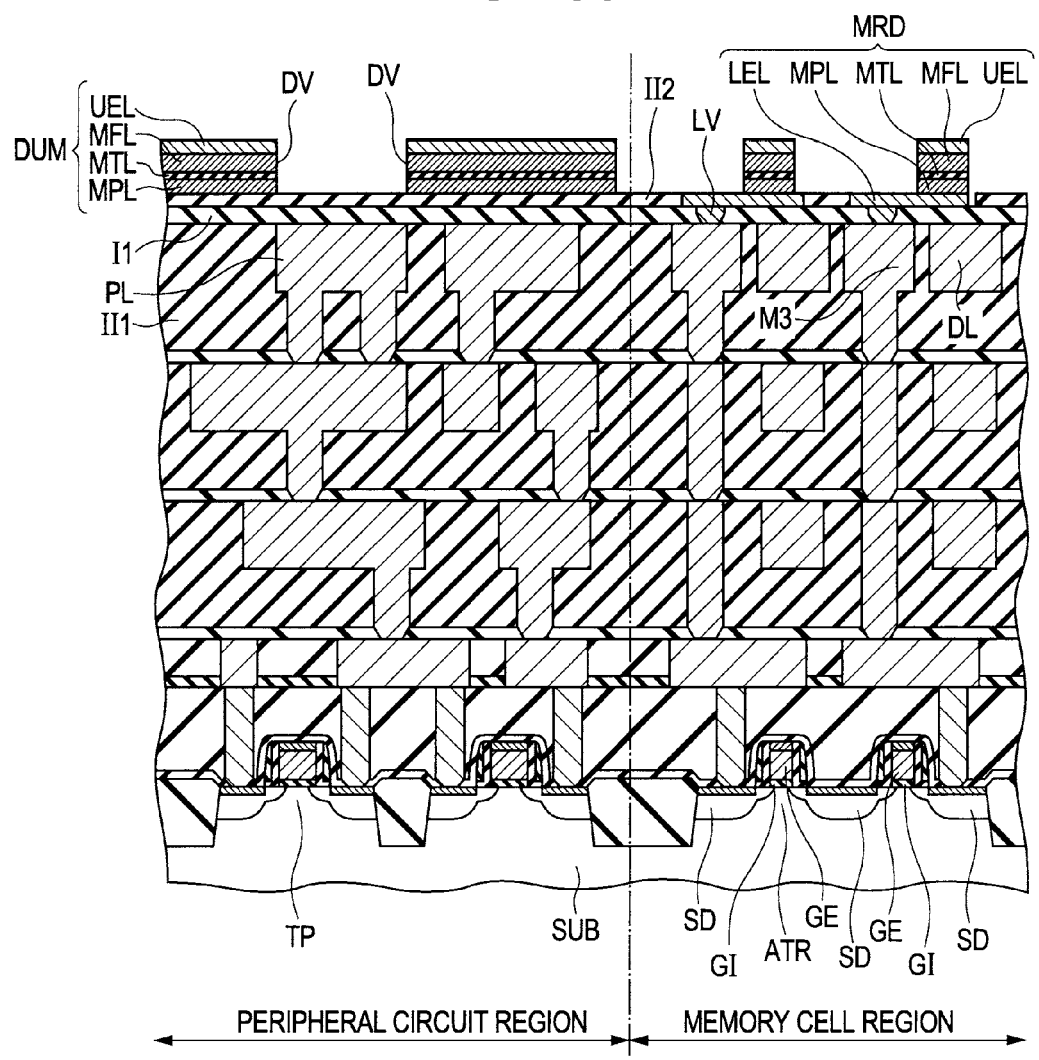
FIG. 38 is a cross-sectional view showing a step corresponding to FIG. 18 of the method for manufacturing the memory cell region and the peripheral circuit region shown in FIG. 36.

Then, a method for manufacturing a MRAM shown in FIG. 36 as the semiconductor device of the present embodiment will be described by reference to FIGS. 37 and 38. Incidentally, FIGS. 37 and 38 show the memory cell region and the sense amplifier region. Further, FIGS. 37 and 38 each show the same cross section as the cross section shown in FIG. 36.

The configuration of FIG. 36 is formed by using the same method as the second processing method shown in FIGS. 14 to 18 of the first embodiment. Referring to FIG. 37, after the step shown in FIG. 10 of the first embodiment, the lower electrode LEL is formed by the same procedure as that of FIG. 14. However, at this time, in the peripheral circuit region, the lower electrode equivalent layer LEL is not formed. Namely, in the peripheral circuit region, the prescribed film LEL to be the lower electrode are entirely removed by etching.

Referring to FIG. 38, subsequently, the same processings as the steps shown in FIGS. 15 to 18 of the first embodiment are performed. As a result, in the peripheral circuit region, there is formed the dummy multilayer structures DMM in which the silicon oxide film II2 is interposed therein in place of the lower electrode equivalent layer LEL. The silicon oxide film II2 is formed by the step shown in FIGS. 15 and 16 of the first embodiment. From this point onward, the same respective processings (shown in FIGS. 19 to 22) as those of the first embodiment are performed. This results in the formation of a semiconductor device having the cross section shown in FIG. 36.

In the foregoing points, the present embodiment is different from the first embodiment, and, in other points, is equal in configuration to the first embodiment. For this reason, the same elements as those of the first embodiment are given the same reference numerals and signs, and a description thereon will not be repeated.

Then, the advantageous effects of the present embodiment will be described. The present embodiment has, in addition to the advantageous effects of the first embodiment, the following effects.

In the present embodiment, by using the manufacturing method shown in FIGS. 37 and 38, the dummy multilayer structures DMM having the pinned equivalent layer MPL, the free equivalent layer MFL, and the like can be formed irrespective of the presence or absence of the lower electrode equivalent layer LEL. In this case, there is raised the degree of freedom for selecting the size in plan view of each film forming the dummy multilayer structure DMM.

For example, when the first processing method shown in FIGS. 11 to 13 of the first embodiment is used, with the previously formed upper electrode (upper electrode equivalent layer) UEL as a mask, the free layer (the free equivalent layer) MFL, and the like are patterned. Further, thereafter, the lower electrode (lower electrode equivalent layer) LEL is patterned. Accordingly, the size of the lower electrode (lower electrode equivalent layer) LEL in plan view necessarily becomes larger than the size of the upper electrode (upper electrode equivalent layer) UEL, and the like in plan view. However, use of the manufacturing method of the present embodiment also enables the formation of the upper electrode (upper electrode equivalent layer) UEL larger in plan view than the lower electrode (lower electrode equivalent layer) LEL. Therefore, it is possible to adjust the occupancy rate, if required, such as an increase in occupancy rate of the pinned equivalent layer MPL, the free equivalent layer MFL, and the like of the dummy multilayer structure DMM.

Incidentally, the configuration of the present embodiment may be combined with the second embodiment and the third embodiment. The fourth embodiment of the present invention is different in only respective points described above from the first embodiment of the present invention. Namely, for the fourth embodiment of the present invention, configurations and conditions, procedures, effects, and the like not described above all follow those of the first embodiment of the present invention.

Fifth Embodiment

The present embodiment is different in storage element to be disposed from the first embodiment. Below, the configuration of the present embodiment will be described by reference to FIG. 39.

Figure 39:
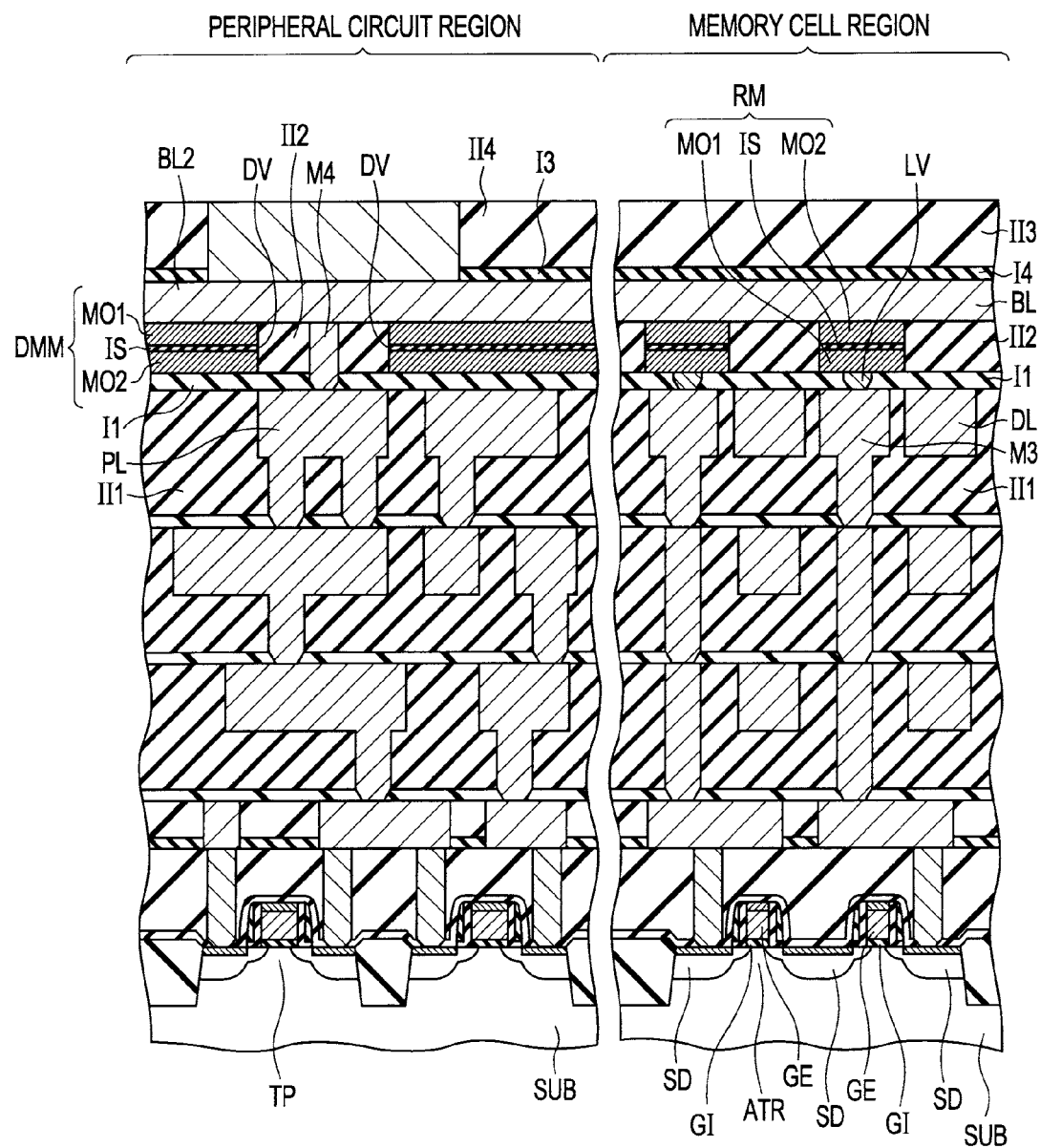
FIG. 39 is a cross-sectional view showing a memory cell region and a peripheral circuit region in a ReRAM in the same direction as that of FIG. 4 in a fifth embodiment of the present invention.

Referring to FIG. 39, in the present embodiment, the MRAM of the first embodiment is replaced with a so-called ReRAM (resistance recording element RM). For the ReRAM, there is used a material changing in electrical resistance value according to the applied voltage. The change in electrical resistance value in the ReRAM corresponds to the change in the direction of magnetization in the free layer MFL in the MRAM. Thus, the change in the electrical resistance value is read or written. In order to apply the voltage, and to change the electrical resistance value, or to read the electrical resistance value, the wires such as the bit lines BL (first wires) are used.

Incidentally, the plan view showing the configuration of the semiconductor chip of the present embodiment can be illustrated by replacing the magnetoresistive elements MRD of FIG. 3 with the resistance recording elements RM.

A memory cell of the ReRAM formed in the memory cell region of FIG. 39 has a first metal electrode M01, an insulation film IS, and a second metal electrode MO2, and has a multilayer structure in which, for example, the first metal electrode MO1, the insulation film IS, and the second metal electrode MO2 are stacked in this order from the bottom. Namely, the ReRAM has, as with the MRAM, a structure of lamination of thin films of metal materials. The first metal electrode MO1 is formed in such a manner as to be in contact with the top surface of the local via LV. Whereas, the second metal electrode MO2 forms the top surface of the resistance recording element RM. The second metal electrode MO2 and the bit line BL disposed thereover are directly coupled with each other. This ensures an electrical coupling between the upper electrode UEL and the bit line BL without a coupling wire interposed therebetween.

In the peripheral circuit region to which the bit line BL in the memory cell region extends, at the same (the interlayer insulation layer II2-equivalent) layer as the layer at which the interlayer insulation layer II2 and the resistance recording element RM are disposed in the memory cell region, the dummy multilayer structures DMM (multilayer structures) are disposed. The dummy multilayer structures DMM are, as with the first embodiment, disposed under the bit line BL2 in such a manner as to overlap the bit line BL2 in plan view (so as to be in the same planar shape as that of the bit line BL2). Namely, the dummy multilayer structure DMM has a shape extending in such a manner as to be along the bit line BL2. Particularly, in the present embodiment, the dummy multilayer structure DMM is disposed in such a manner as to overlap the entire surface of the bit line BL2 in plan view.

The dummy multilayer structure DMM preferably has a multilayer structure in which the layers of the same materials as those of respective layers forming the resistance recording element RM are stacked. Namely, preferably, the first metal electrode equivalent layer M01, the insulation film equivalent layer IS, and the second metal electrode equivalent layer MO2 are stacked in this order so as to have the same thicknesses as those of their respective corresponding films of the resistance recording element RD, respectively.

As described above, the dummy multilayer structures DMM are disposed in such a manner as to overlap the bit lines BL2 in plan view. As a result, each dummy multilayer structure DMM is disposed in such a manner as not to overlap both of a pair of bit lines BL2 adjacent to each other in plan view. In this respect, the present embodiment is the same as the first embodiment.

Then, the materials, film thicknesses, and the like of respective parts will be described. The first metal electrode MO1 and the second metal electrode MO2 preferably includes a metal material having a high etching selectivity with respect to the silicon oxide film forming the interlayer insulation layer II2, such as Pt, Ru, or Ta. Especially, particularly, the second metal electrode MO2 preferably includes a metal material having a high etching selectivity with respect to the silicon oxide film forming the interlayer insulation layer II2. As one example, for example, the first metal electrode MO1 includes Pt having a thickness of 100 nm, and the second metal electrode MO2 includes Pt having a thickness of 50 nm.

The insulation film IS interposed between a pair of metal electrodes MO preferably includes a metal oxide film. For example, there is preferably used a thin film of $TiO_2$ (titanium oxide) or CoO (cobalt oxide). Alternatively, the insulation film IS preferably includes a lamination of thin films of $TiO_2$ and TiN. As one example, preferably, for example, 50-nm thick TiN and 70-nm thick $TiO_2$ are stacked in this order.

In the foregoing points, the present embodiment is different from the first embodiment, and, in other points, is equal in configuration to the first to fourth embodiments. For this reason, the same elements as those of the first to fourth embodiments are given the same reference numbers and signs, and a description thereon will not be repeated. Further, also for the semiconductor device of the present embodiment, the basic manufacturing method is the same as that of the first embodiment.

Therefore, other basic features of the present embodiment can be illustrated by replacing the magnetoresistive elements MRD and the dummy multilayer structures DMM of FIGS. 3 to 38 illustrating all the first to fourth embodiments with the multilayer structures of the resistance recording elements RM.

Specifically, for example, as shown in FIG. 3, the dummy multilayer structure DMM of the present embodiment has a shape extending in such a manner as to be along the bit line BL2. However, the dummy via DV is preferably formed so as not to overlap a region overlapping the interlayer coupling wire M4 in plan view.

Further, also in the present embodiment, the sum of occupancy rates of regions in which the dummy multilayer structures DMM are disposed relative to the whole of peripheral circuit region in plan view is preferably larger than the sum of occupancy rates of regions in which the resistance recording elements RM are disposed in the whole of the memory cell region.

Still further, also in the present embodiment, as shown in FIG. 33, the dummy multilayer structure in the peripheral circuit region is preferably divided into a plurality of small multilayer structures at other than the positions overlapping the interlayer coupling wire M4 in plan.

Furthermore, also in the present embodiment, some dummy multilayer structures each overlap the bit line BL2 in plan view. However, for example, as shown in FIG. 33, the dummy multilayer structures may be disposed smaller or may be disposed larger than the bit lines BL2. Alternatively, for example, as shown in FIG. 3, the dummy multilayer structure may be disposed in such a manner as to overlap the entire surface of the bit line BL2 in plan view.

Also in the present embodiment, as shown in FIG. 35, in addition to the dummy multilayer structures DMM1 and DMM2 at positions overlapping the bit lines BL2 (the same configuration as that of the dummy multilayer structures DMM of FIG. 39), dummies DM (additional multilayer structures) may also be formed at positions at which the bit lines BL2 are not disposed in plan view.

The present embodiment having the foregoing configuration basically has the same advantageous effects as those of the first to fourth embodiments. This is for the following reason: the semiconductor device having the ReRAMs of the present embodiment has the dummy multilayer structures DMM equal in configuration to the ReRAMs, and hence can suppress the occurrence of defective conditions shown in the comparative example of FIGS. 23 to 32 based on the same principle as that of the MRAM. Therefore, the details of the advantageous effects of the present embodiment are not herein described.

The fifth embodiment of the present invention is different in only respective points described above from the first embodiment of the present invention. Namely, for the fifth embodiment of the present invention, the configurations, conditions, procedures, effects, and the like, not described above all follow the first embodiment of the present invention.

Sixth Embodiment

The present embodiment is different in storage element to be disposed from the first embodiment. Below, the configuration of the present embodiment will be described by reference to FIG. 40.

Figure 40:
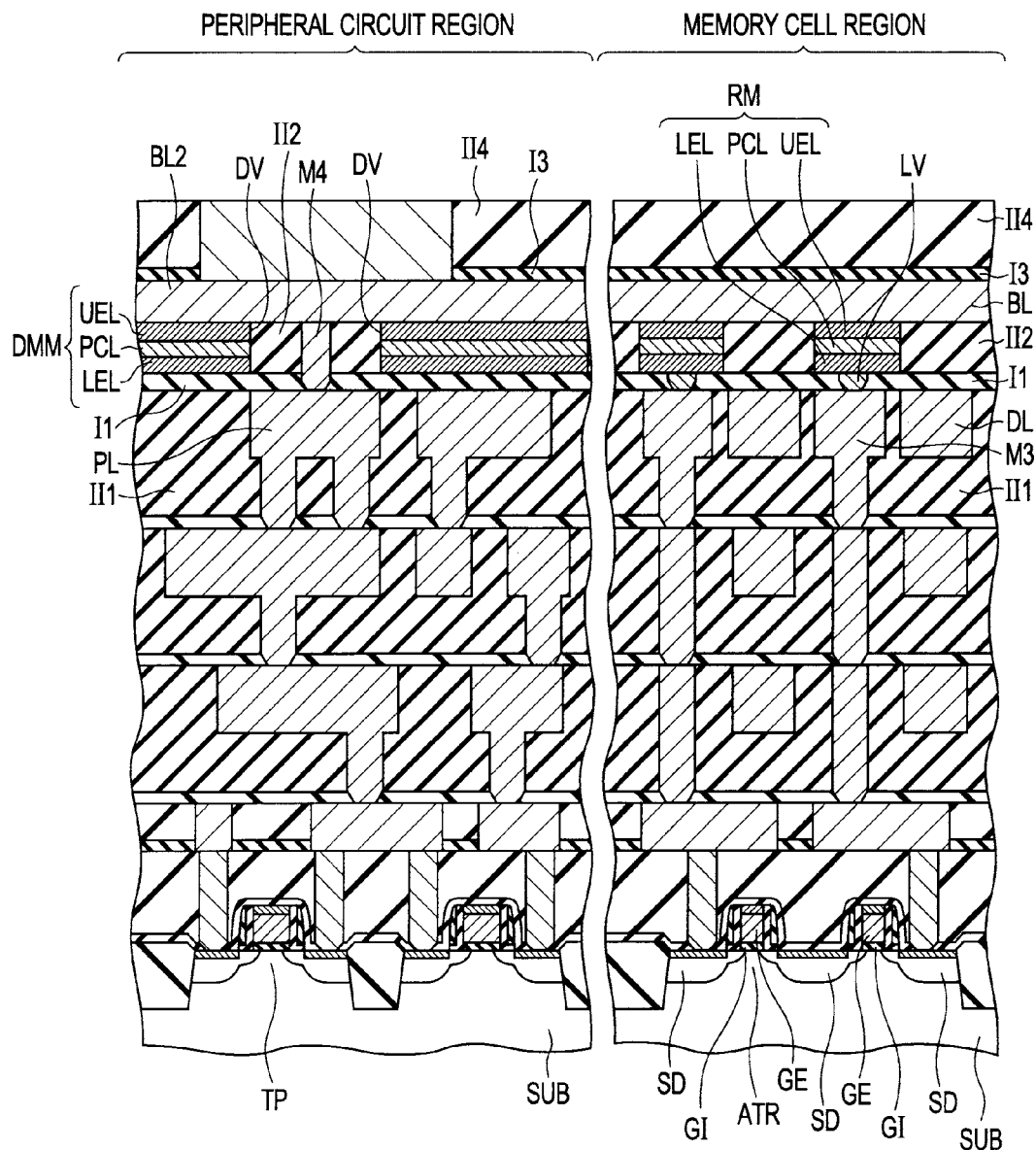
FIG. 40 is a cross-sectional view showing a memory cell region and a peripheral circuit region in a PRAM in the same direction as that of FIG. 4 in a sixth embodiment of the present invention.

Referring to FIG. 40, in the present embodiment, the MRAMs of the first embodiment are replaced with so-called PRAMs (phase change recording elements PM). The PRAM changes in crystal state of the phase-changing material interposed between the upper electrode and the lower electrode according to the value of the applied voltage. The phase-changing material means a material changing in value of the electrical resistance by the change in crystal state. The change in value of the electrical resistance (crystal state) in the PRAM corresponds to the change in direction of magnetization in the free layer MFL in the MRAM. Thus, the change in value of the electrical resistance is read or written. In order to apply the voltage for changing the value of the electrical resistance, and to read the value of the electrical resistance, wires such as the bit lines BL (first wires) are used.

Incidentally, the plan view showing the configuration of the semiconductor chip of the present embodiment can be illustrated by replacing the magnetoresistive elements MRD of FIG. 3 with the phase change recording elements PM.

A memory cell of the PRAM formed in the memory cell region of FIG. 40 has a lower electrode LEL (first metal electrode), a phase change layer PCL, and an upper electrode UEL (second metal electrode), and has a multilayer structure in which, for example, the lower electrode LEL, the phase change layer PCL, and the upper electrode UEL are stacked in this order from the bottom. Namely, the PRAM has, as with the MRAM, a structure of lamination of thin films of metal materials. The lower electrode LEL is formed in such a manner as to be in contact with the top surface of the local via LV. Whereas, the upper electrode UEL forms the top surface of the phase change recording element PM. Thus, the upper electrode UEL and the bit line BL disposed thereover are directly coupled with each other. This ensures an electrical coupling between the upper electrode UEL and the bit line BL without a coupling wire interposed therebetween.

In the peripheral circuit region to which the bit line BL in the memory cell region extends, at the same (the interlayer insulation layer II2-equivalent) layer as the layer at which the interlayer insulation layer II2 and the phase change recording element PM are disposed in the memory cell region, the dummy multilayer structures DMM (multilayer structures) are disposed. The dummy multilayer structures DMM are, as with the first embodiment, disposed under the bit line BL2 in such a manner as to overlap the bit line BL2 in plan view (so as to be in the same planar shape as that of the bit line BL2). Namely, the dummy multilayer structure DMM has a shape extending in such a manner as to be along the bit line BL2. Particularly, in the present embodiment, the dummy multilayer structure DMM is disposed in such a manner as to overlap the entire surface of the bit line BL2 in plan view.

The dummy multilayer structure DMM preferably has a multilayer structure in which the layers of the same materials as those of respective layers forming the phase change recording element PM are stacked. Namely, preferably, the lower electrode equivalent layer LEL, the phase change equivalent layer PCL, and the upper electrode equivalent layer UEL are stacked in this order so as to have the same thicknesses as those of their respective corresponding films of the phase change recording element PM.

As described above, the dummy multilayer structures DMM are disposed in such a manner as to overlap the bit lines BL2 in plan view. As a result, each dummy multilayer structure DMM is disposed in such a manner as not to overlap both of a pair of bit lines BL2 adjacent to each other in plan view. In this respect, the present embodiment is the same as the first embodiment.

Then, the materials, film thicknesses, and the like of respective parts will be described. The lower electrode LEL and the upper electrode UEL preferably include a metal material having a high etching selectivity with respect to the silicon oxide film forming the interlayer insulation layer II2, such as W (tungsten), Pt, Ru, or Ta. Out of these, particularly, the upper electrode UEL preferably includes a metal material having a high etching selectivity with respect to the silicon oxide film forming the interlayer insulation layer II2. As one example, for example, the lower electrode LEL includes Pt having a thickness of 100 nm, and the upper electrode UEL includes Pt having a thickness of 50 nm.

The phase change layer PCL interposed between the lower electrode LEL and the upper electrode UEL preferably includes a phase-changing material such as GeSbTe (germanium•antimony•tellurium: GST). The phase change layer PCL increases in electrical resistance when the ratio of amorphous phase increases particularly in the vicinity of the lower electrode LEL by phase change; and decreases in electrical resistance when the ratio of amorphous phase decreases in the vicinity. As one example, the phase change layer PCL preferably includes a chalcogenide semiconductor film such as a GeSbTe film with a thickness of 100 nm.

In the foregoing points, the present embodiment is different from the first embodiment, and, in other points, is equal in configuration to the first to fourth embodiments. For this reason, the same elements as those of the first to fourth embodiments are given the same reference numerals and signs, and a description thereon will not be repeated. Also for the semiconductor device of the present embodiment, the basic manufacturing method is the same as that of the first embodiment.

Therefore, other basic features of the present embodiment can be illustrated by replacing the magnetoresistive elements MRD and the dummy multilayer structures DMM of FIGS. 3 to 38 illustrating all the first to fourth embodiments with the multilayer structures of the phase change recording elements PM.

Specifically, for example, as shown in FIG. 3, the dummy multilayer structure DMM of the present embodiment has a shape extending in such a manner as to be along the bit line BL2. However, the dummy via DV is preferably formed so as not to overlap a region overlapping the interlayer coupling wire M4 in plan view.

Further, also in the present embodiment, the sum of occupancy rates of regions in which the dummy multilayer structures DMM are disposed relative to the whole of peripheral circuit region in plan view is preferably larger than the sum of occupancy rates of regions in which the phase change recording elements PM are disposed in the whole of the memory cell region.

Still further, also in the present embodiment, as shown in FIG. 33, the dummy multilayer structure in the peripheral circuit region is also preferably divided into a plurality of small multilayer structures at other than positions overlapping the interlayer coupling wire M4 in plan.

Furthermore, also in the present embodiment, some dummy multilayer structures each overlap the bit line BL2 in plan view. However, for example, as shown in FIG. 33, the dummy multilayer structures may be disposed smaller or may be disposed larger than the bit lines BL2. Alternatively, for example, as shown in FIG. 3, the dummy multilayer structure may be disposed in such a manner as to overlap the entire surface of the bit line BL2 in plan view.

Also in the present embodiment, as shown in FIG. 35, in addition to the dummy multilayer structures DMM1 and DMM2 at positions overlapping the bit lines BL2 (the same configuration as that of the dummy multilayer structures DMM of FIG. 39), dummies DM (additional multilayer structures) may also be formed at positions at which the bit lines BL2 are not disposed in plan view.

The present embodiment having the foregoing configuration basically has the same advantageous effects as those of the first to fourth embodiments. This is for the following reason: the semiconductor device having the PRAMs of the present embodiment has the dummy multilayer structures DMM equal in configuration to the PRAMs, and hence can suppress the occurrence of defective conditions shown in the comparative example of FIGS. 23 to 32 based on the same principle as that of the MRAM. Therefore, the details of the advantageous effects of the present embodiment are not herein described.

The sixth embodiment of the present invention is different in only respective points described above from the first embodiment of the present invention. Namely, for the sixth embodiment of the present invention, the configurations, conditions, procedures, effects, and the like, not described above all follow the first embodiment of the present invention.

The embodiments disclosed this time should be considered to be illustrative but not exclusive in all respects. The scope of the present invention is defined by not the foregoing description but the appended claims, which are intended to include equivalent meanings of the scope of the claims and all of the modifications within the scope.

The present invention is advantageously applicable to a semiconductor device having a storage device including a multilayer structure of a metal material.

What is claimed is:

1. A semiconductor device, comprising:
a semiconductor substrate having a main surface;
a memory cell region including a plurality of magnetoresistive elements formed over the main surface of the semiconductor substrate, and changing in electrical resistance according to the direction of magnetization, disposed therein, the magnetoresistive element including a magnetization fixed layer fixed in direction of magnetization, a magnetization free layer made variable indirection of magnetization, and a tunneling insulation layer interposed between the magnetization fixed layer and the magnetization free layer;
an interlayer insulation film disposed at the same layer as the magnetoresistive elements;
a peripheral circuit region disposed in the periphery of the memory cell region in plan view;
a plurality of first wires formed above the magnetoresistive elements, extending in the direction along the main surface, and coupled to the top surfaces of the magnetoresistive elements; and
a multilayer structure disposed in the peripheral circuit region so as to overlap a second wire formed of the same layer as the first wire in plan view, the multilayer structure comprising a layer equal in material to the magnetization free layer forming the magnetoresistive element, a layer equal in material to the tunneling insulation layer, and a layer equal in material to the magnetization fixed layer,
wherein the multilayer structure is disposed so as not to overlap both of a pair of the adjacent second wires in plan view in the peripheral circuit region.

2. The semiconductor device according to claim 1, wherein the multilayer structure extends along the second wire in the peripheral circuit region in plan view.

3. The semiconductor device according to claim 1, wherein the multilayer structure is divided into a plurality of small multilayer structures with respect to the direction along the second wire in the peripheral circuit region in plan view.

4. The semiconductor device according to claim 3, wherein the small multilayer structure is disposed in such a manner as not to overlap a coupling wire for electrically coupling the second wire and other circuits over the main surface in plan view.

5. The semiconductor device according to claim 1, wherein the multilayer structure is disposed smaller than the second wire in plan view.

6. The semiconductor device according to claim 1, wherein the multilayer structure is disposed in such a manner as to overlap the entire surface of the second wire in plan view in the peripheral circuit region.

7. The semiconductor device according to claim 6, wherein the multilayer structure is disposed larger than the second wire in plan view.

8. The semiconductor device according to claim 1, wherein the sum of occupancy rates of regions including the multilayer structures disposed therein relative to the whole of the peripheral circuit region in plan view is larger than the sum of occupancy rates of regions including the magnetoresistive elements disposed therein in the whole of the memory cell region.

9. The semiconductor device according to claim 1, comprising an additional multilayer structure having the same configuration as that of the multilayer structure at a position at which the second wire is not disposed in the peripheral circuit region in plan view.

* * * * *